(12) United States Patent
Shiobara et al.

(10) Patent No.: US 8,872,358 B2
(45) Date of Patent: Oct. 28, 2014

(54) SEALANT LAMINATED COMPOSITE, SEALED SEMICONDUCTOR DEVICES MOUNTING SUBSTRATE, SEALED SEMICONDUCTOR DEVICES FORMING WAFER, SEMICONDUCTOR APPARATUS, AND METHOD FOR MANUFACTURING SEMICONDUCTOR APPARATUS

(71) Applicant: Shin-Etsu Chemical Co., Ltd., Toyko (JP)

(72) Inventors: Toshio Shiobara, Annaka (JP); Hideki Akiba, Annaka (JP); Susumu Sekiguchi, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/749,289

(22) Filed: Jan. 24, 2013

(65) Prior Publication Data

US 2013/0200534 A1    Aug. 8, 2013

(30) Foreign Application Priority Data

Feb. 7, 2012   (JP) .................................. 2012-24452
Mar. 21, 2012  (JP) .................................. 2012-63158

(51) Int. Cl.
*H01L 23/28*      (2006.01)
*H01L 23/48*      (2006.01)
(Continued)

(52) U.S. Cl.
CPC . *B32B 7/02* (2013.01); *H01L 23/31* (2013.01); *H01L 21/78* (2013.01); *B32B 27/00* (2013.01);
(Continued)

(58) Field of Classification Search
USPC .......................... 257/787, 793, 782, 783, 786
See application file for complete search history.

(56) References Cited

U.S. PATENT DOCUMENTS

2003/0127750 A1    7/2003   Hacke et al.
2004/0040740 A1    3/2004   Nakatani et al.
(Continued)

FOREIGN PATENT DOCUMENTS

JP    A-05-283562      10/1993
JP    A-2001-332654    11/2001
(Continued)

OTHER PUBLICATIONS

Jun. 17, 2014 Notification of Reasons for Refusal for Japanese Patent Application No. 2012-63158 (with partial translation).

*Primary Examiner* — Matthew Reames
*Assistant Examiner* — Dilinh Nguyen
(74) *Attorney, Agent, or Firm* — Oliff PLC

(57) ABSTRACT

Described herein is a sealant laminated composite for collectively sealing a semiconductor device's mounting surface of a substrate on which semiconductor devices are mounted or a semiconductor device's forming surface of a wafer on which semiconductor devices are formed. The composite can include a support wafer and an uncured resin layer constituted of an uncured thermosetting resin formed on one side of the support wafer. In certain aspects, the sealant laminated composite is very versatile, even when a large diameter or thin substrate or wafer is sealed. In certain aspects, this can prevent the substrate or wafer from warping and the semiconductor devices from peeling; can collectively seal a semiconductor device's mounting surface of a substrate on which semiconductor devices are mounted or a semiconductor device's forming surface of a wafer on which semiconductor devices are formed on a wafer level; and can provide a sealant laminated composite that is excellent in the heat resistance and humidity resistance after sealing.

12 Claims, 4 Drawing Sheets

(51) Int. Cl.
*H01L 23/52* (2006.01)
*H01L 29/40* (2006.01)
*H01L 23/29* (2006.01)
*B32B 7/02* (2006.01)
*H01L 23/31* (2006.01)
*H01L 21/78* (2006.01)
*B32B 27/00* (2006.01)
*B32B 5/00* (2006.01)
*H01L 21/56* (2006.01)
*H01L 23/00* (2006.01)

(52) U.S. Cl.
CPC ............... *B32B 5/00* (2013.01); *H01L 23/293* (2013.01); *H01L 21/561* (2013.01); *H01L 24/97* (2013.01); *H01L 24/32* (2013.01); *H01L 2224/29099* (2013.01); *H01L 2224/32225* (2013.01); *H01L 2924/10253* (2013.01)

USPC ........... 257/787; 257/782; 257/783; 257/786; 257/793

(56) References Cited

U.S. PATENT DOCUMENTS

| 2004/0115868 | A1* | 6/2004 | Ono ............................... 438/127 |
| 2010/0052153 | A1* | 3/2010 | Koizumi et al. ............... 257/697 |
| 2011/0114984 | A1* | 5/2011 | Seong ............................. 257/98 |

FOREIGN PATENT DOCUMENTS

| JP | A-2002-179885 | 6/2002 |
| JP | A-2004-504723 | 2/2004 |
| JP | A-2007-001266 | 1/2007 |
| JP | A-2009-13309 | 1/2009 |
| JP | A-2009-060146 | 3/2009 |

* cited by examiner (A) COVERING STEP (B) SEALING STEP (C) DICING STEP (D)

SEALANT LAMINATED COMPOSITE, SEALED SEMICONDUCTOR DEVICES MOUNTING SUBSTRATE, SEALED SEMICONDUCTOR DEVICES FORMING WAFER, SEMICONDUCTOR APPARATUS, AND METHOD FOR MANUFACTURING SEMICONDUCTOR APPARATUS

BACKGROUND OF THE INVENTION

1. Field of the Invention

The invention relates to a sealant laminated composite capable of collective seal on a wafer level, a sealed semiconductor devices mounting substrate, a sealed semiconductor devices forming wafer, a semiconductor apparatus, and a method for manufacturing a semiconductor apparatus.

2. Description of the Related Art

Various methods have been proposed and studied for sealing, on a wafer level, a semiconductor devices mounting surface of a substrate on which semiconductor devices are mounted, or a semiconductor devices forming surface of a wafer on which semiconductor devices are formed. A method of sealing by spin coating, a method for sealing by screen printing (Patent Document 1), and a method where a composite sheet that is obtained by coating a hot-melt epoxy resin on a film support is used (Patent Documents 2 and 3) can be cited.

Recently, as the method for sealing, on a wafer level, the semiconductor devices mounting surface of a substrate on which semiconductor devices are mounted among these methods, the following method is being put into practical use as a mass-production method (Patent Document 4). According to the method, after a film having an adhesive layer on both sides thereof is stuck or an adhesive is coated by spin coating on an upper part of a metal, a silicon wafer or a glass substrate, semiconductor devices are arranged, stuck and mounted on the substrate to form a semiconductor devices mounting surface. The semiconductor devices mounting surface is then sealed by compression molding under a heated condition with a liquid epoxy resin or an epoxy molding compound. Similarly, as the method for sealing on a wafer level, the semiconductor devices forming surface of a wafer on which semiconductor devices are formed, a method where the semiconductor devices forming surface is sealed with an liquid epoxy resin or an epoxy molding compound by compression molding under a heated condition is being put into practical use recently as a mass production method.

According to the methods described above, when a wafer or a substrate constituted of metal and so on, having a small diameter, for example, about 200 mm (8 inches) is used, even at the present time, there is no serious problem in sealing. However, when a semiconductor devices mounting substrate or a semiconductor devices forming wafer, having a large diameter of 300 mm (12 inches) or more, is sealed, there is a serious problem that, owing to contraction stress of a resin such as an epoxy resin during sealing and curing, the substrate or wafer is warped. Further, when the semiconductor devices mounting surface of a semiconductor devices mounting substrate having a large diameter is sealed on a wafer level, a problem that owing to contraction stress of a resin such as an epoxy resin during sealing and curing, a semiconductor device peels away from a substrate such as metal; therefore mass-production cannot be put into practical use.

As a method for solving the problems accompanying such a large diameter substrate on which semiconductor devices are mounted or such a large diameter wafer on which semiconductor devices are formed, a method where a filler is charged by about 90% by weight in a sealing resin composition, and a method where the sealing resin composition is made lower in the elasticity to make smaller the contraction stress during curing can be cited (Patent Documents 1, 2, and 3).

However, when the filler is charged by about 90% by weight, the viscosity of a sealing resin composition rises, and when the sealing resin composition is molded by casting and sealed, a force is applied on semiconductor devices mounted on a substrate. As a result, there occurs a new problem in that the semiconductor devices peeled away from the substrate. Further, when the sealing resin is made low in the elasticity, warp of the sealed substrate on which semiconductor devices are mounted or the sealed wafer on which semiconductor devices are formed is improved. However, a new problem in that sealing performance such as heat resistance and humidity resistance is deteriorated. Therefore, these solving methods were not fundamental solving methods. In view of the above situations, there is a demand for a sealing material with which, even when a large diameter wafer or a large diameter substrate such as metal is sealed, without warp of the substrate or wafer and semiconductor devices peeled away from the substrate, the semiconductor devices mounting surface of a substrate on which semiconductor devices are mounted or the semiconductor devices forming surface of a wafer on which semiconductor devices are formed can be collectively sealed on a wafer level, and after sealing, sealing performance such as the heat resistance and the humidity resistance is excellent.

CITATION LIST

Patent Literature

[Patent Document 1] Japanese Patent Application Publication No. 2002-179885

[Patent Document 2] Japanese Patent Application Publication No. 2009-60146

[Patent Document 3] Japanese Patent Application Publication No. 2007-001266

[Patent Document 4] Published Japanese Translation of PCT International Application No. 2004-504723

SUMMARY OF THE INVENTION

In addition to the above-mentioned, even when a sealing material excellent in the sealing performance such as the heat resistance and the humidity resistance is used to seal, when an ionic impurity derived from a fiber base material or an ionic impurity intruded from the outside of a semiconductor apparatus, and an ionic impurity derived from a semiconductor apparatus or a semiconductor devices mounting substrate are slightly contained in the sealing material, there is a problem in that the reliability of the semiconductor apparatus is reduced.

The invention was performed to solve the above problems. It is an object of the invention to provide a very versatile sealant laminated composite by which, even when a thin substrate or wafer having a large diameter is sealed, the substrate or the wafer can be prevented from warping and the semiconductor devices can be suppressed from peeling, the semiconductor devices mounting surface of a substrate on which semiconductor devices are mounted and the semiconductor devices forming surface of a wafer on which semiconductor devices are formed can be each collectively sealed on a wafer level, and after sealing, the sealing performance such as the heat resistance and the humidity resistance is excellent.

Further, it is an another object of the invention to provide a sealed semiconductor devices mounting substrate and a sealed semiconductor devices forming wafer, sealed with the sealant laminated composite, a semiconductor apparatus obtained by dicing the sealed semiconductor devices mounting substrate and the sealed semiconductor devices forming wafer into each piece, and a method for manufacturing a semiconductor apparatus by using the sealant laminated composite.

In order to solve the above problems, the invention provides a sealant laminated composite for collectively sealing a semiconductor devices mounting surface of a substrate on which semiconductor devices are mounted or a semiconductor devices forming surface of a wafer on which semiconductor devices are formed, including a support wafer and an uncured resin layer constituted of an uncured thermosetting resin formed on one side of the support wafer.

With the sealant laminated composite, the support wafer can suppress the contraction stress of the uncured resin layer during sealing and curing. Accordingly, even when a thin substrate or wafer having a large diameter is sealed, the warp of a substrate or a wafer and the peeling of semiconductor devices can be prevented from occurring, the semiconductor devices mounting substrate and semiconductor devices forming wafer can be collectively sealed on a wafer level. After sealing, the sealant laminated composite is excellent in the sealing performance such as the heat resistance and the humidity resistance and very versatile.

The difference between the expansion coefficient of the support wafer and that of a substrate on which the semiconductor devices are mounted or a wafer on which the semiconductor devices are formed is preferable to be 3 ppm or less.

When the difference between the expansion coefficients is 3 ppm or less, the difference of the expansion coefficient of the support wafer and that of the substrate or wafer on which the semiconductor devices are mounted or formed is reduced; thereby, the warp of the substrate or wafer to be sealed and the peeling of the semiconductor device can be preferably, more surely suppressed.

Further, the thickness of the uncured resin layer depends on the thickness of semiconductor devices mounted or formed on a wafer. In order to secure high reliability, the thickness of a sealing resin layer from a top surface of the semiconductor devices (in a vertical direction) is 10 to 2000 μm. From this, the thickness of the uncured resin layer is preferable to be 20 μm or more and 2000 μm or less. When the thickness of the uncured resin layer is 20 μm or more, a necessary thickness of the sealing resin layer on the semiconductor devices can be secured and thereby failure of filling properties due to extreme thinness and non-uniformity of a film thickness can be preferably prevented from occurring. When the thickness of the uncured resin layer is 2000 μm or less, it can be preferably prevented for the thicknesses of the sealed wafer and semiconductor apparatus from being too thick to enable high packaging density.

Further, the uncured resin layer preferably contains any one of an epoxy resin, a silicone resin, and an epoxy/silicone mixed resin that solidify at less than 50° C. and melt at 50° C. or more and 150° C. or less.

The uncured resin layer is easy to handle and excellent in the sealing characteristics. With the uncured resin layer, the support wafer very small in the difference between the expansion coefficients can suppress the contraction stress during curing of the uncured resin layer containing these resins; accordingly, even when at large diameter, thin substrate or wafer is sealed, the substrate or wafer can be more surely prevented from warping, semiconductor devices can be surely prevented from peeling, the sealant laminated composite that can collectively seal a semiconductor devices forming surface of a wafer on which semiconductor devices are formed on a wafer level can be achieved. The sealant laminated composite having the uncured resin layer containing these resins is particularly excellent in the sealing characteristics such as the heat resistance and the humidity resistance after sealing.

Further, the support wafer is preferably a resin-impregnated fiber base material constituted of a fiber base material impregnated with a thermosetting resin composition that is semi-cured or cured. The uncured resin layer is preferably constituted of an uncured thermosetting resin composition formed on one side of the resin-impregnated fiber base material with a thickness more than 200 μm and 2000 μm or less. At least one of the thermosetting resin composition that is impregnated in the fiber base material and the thermosetting resin composition that constitutes the uncured resin layer preferably contains an ion trapping agent.

In the sealant laminated composite, the thickness of the uncured resin layer is appropriate and the resin-impregnated fiber base material having very small expansion coefficient can suppress the contraction stress of the uncured resin layer during sealing and curing. Accordingly, even when a large diameter organic substrate, a large diameter substrate such as metal, or wafer is sealed, while the substrate or wafer is prevented from warping and the semiconductor devices are prevented from peeling away from the substrate, the semiconductor devices mounting surface can be collectively sealed on a wafer level and, after sealing, the sealing characteristics such as the heat resistance and the humidity resistance are excellent. Further, by containing an ion trapping agent, a semiconductor apparatus high in the reliability can be provided, and a sealant laminated composite high in the versatility is obtained.

Further, both the thermosetting resin composition that is impregnated in the fiber base material and the thermosetting resin composition that constitutes the uncured resin layer are preferable to contain the ion trapping agent.

Thereby, ionic impurities intruding from the outside of the semiconductor apparatus, and ionic impurities derived from the fiber base material, the semiconductor devices, and the semiconductor device mounting substrate can be surely trapped. Accordingly, the sealant laminated composite can provide a semiconductor apparatus higher in the reliability.

Further, according to the invention, a sealed semiconductor devices mounting substrate and a sealed semiconductor devices forming wafer are provided. The sealed semiconductor devices mounting substrate and the sealed semiconductor devices forming wafer are obtained in such a manner that the semiconductor devices mounting surface of a substrate or the semiconductor devices forming surface of a wafer on which semiconductor devices are mounted or formed is covered with the uncured resin layer of the sealant laminated composite, and the uncured resin layer is heated and cured to collectively seal the semiconductor devices mounting or forming surface with the sealant laminated composite.

In the sealed semiconductor devices mounting substrate and the sealed semiconductor devices forming wafer, the wafer can be prevented from warping and the semiconductor devices can be prevented from peeling.

Further, according to the invention, a semiconductor apparatus obtained by dicing the sealed semiconductor devices mounting substrate or the sealed semiconductor devices forming wafer into each piece is provided.

The semiconductor apparatus is sealed with the sealant laminated composite excellent in the sealing characteristics such as the heat resistance and the humidity resistance and manufactured by using a substrate or wafer with suppressed warp; accordingly, the semiconductor apparatus has less residual stress and high quality.

Further, the invention provides a method for manufacturing a semiconductor apparatus, including the steps of: covering a semiconductor devices mounting surface of a substrate on which semiconductor devices are mounted or a semiconductor devices forming surface of a wafer on which semiconductor devices are formed with the uncured resin layer of the sealant laminated composite; collectively sealing the semiconductor devices mounting surface or the semiconductor devices forming surface by heating and curing the uncured resin layer to form a sealed semiconductor devices mounting substrate or a sealed semiconductor devices forming wafer; and dicing the sealed semiconductor devices mounting substrate or the sealed semiconductor devices forming wafer into each piece to manufacture the semiconductor apparatus.

According to the method for manufacturing a semiconductor apparatus, in the step of covering, the semiconductor devices mounting surface or the semiconductor devices forming surface can be readily covered with the uncured resin layer of the sealant laminated composite without filling failure. Further, by using the sealant laminated composite, the support wafer can suppress the contraction stress during curing of the uncured resin layer; accordingly, in the step of sealing, the semiconductor devices mounting surface or the semiconductor devices forming surface can be collectively sealed, and, even when a large diameter, thin substrate or wafer is sealed, a sealed semiconductor devices mounting substrate and a sealed semiconductor devices forming wafer is prevented from warping and the semiconductor devices are prevented from peeling can be obtained. Further, in the step of dicing into each piece, a semiconductor apparatus can be diced into each piece from the sealed semiconductor devices mounting substrate and the sealed semiconductor devices forming wafer that are sealed with the sealant laminated composite that is excellent in the sealing characteristics such as the heat resistance and the humidity resistance and suppressed from warping; accordingly, the method for manufacturing a semiconductor apparatus can manufacture high quality semiconductor apparatus.

As described above, with the sealant laminated composite of the invention, the support wafer can suppress the contraction stress of the uncured resin layer during curing and sealing; accordingly, even when a large diameter, thin substrate or wafer is sealed, the substrate or wafer can be prevented from warping and the semiconductor devices can be prevented from peeling, the semiconductor devices forming surface of a wafer on which semiconductor devices are formed can be collectively sealed on a wafer level, and after sealing, a sealant laminated composite is excellent in the sealing performance such as the heat resistance and the humidity resistance and very versatile. Further, The sealed semiconductor devices mounting substrate and the sealed semiconductor devices forming wafer that are sealed with the sealant laminated composite are prevented from producing its warp and peeled semiconductor devices. Further, a semiconductor apparatus obtained by dicing, into each piece, the sealed semiconductor devices mounting substrate and the sealed semiconductor devices forming wafer, which are sealed with the sealant laminated composite excellent in the sealing performance such as the heat resistance and the humidity resistance and prevented from warping is high in quality. Further, according to the method for manufacturing a semiconductor apparatus with sealant laminated composite, a high quality semiconductor apparatus can be manufactured.

DESCRIPTION OF THE PREFERRED EMBODIMENT

Figure 1:
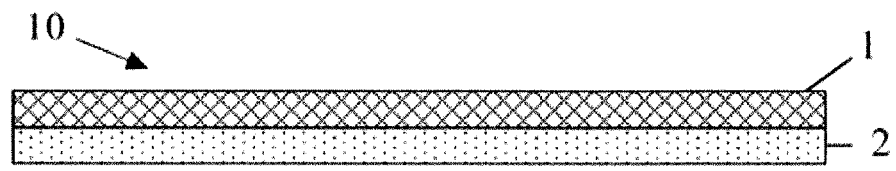
FIG. 1 is an example of a cross-sectional view of a sealant laminated composite of the invention.

Hereinafter, a sealant laminated composite, a sealed semiconductor devices mounting substrate and a sealed semiconductor devices forming wafer, a semiconductor apparatus of the invention and a method for manufacturing a semiconductor apparatus will be described in detail. However, the invention is not limited thereto.

As described above, there is a demand for a sealant that can prevent the substrate or wafer from warping and the semiconductor device from peeling, can collectively seal a semiconductor devices forming surface of a wafer on which semiconductor devices are formed on a wafer level, and is excellent in the sealing performance such as the heat resistance or the humidity resistance after sealing and very versatile, even when a large diameter, thin substrate or wafer on which semiconductor devices are formed is sealed.

The inventors studied hard to solve the problems and found that with a sealant laminated composite that has a support wafer and an uncured resin layer constituted of an uncured thermosetting resin that is laminated and formed on one side of the support wafer, the contraction stress during resin curing can be suppressed by the support wafer, and, by reducing the difference of the expansion coefficient of the support wafer and that of the wafer on which the semiconductor devices are formed, the contraction stress during curing of the uncured resin layer can be further suppressed. The inventors further found that, by the suppression effect of the contraction stress, even when a large diameter, thin substrate or wafer is sealed, the substrate or wafer can be prevented from warping and the semiconductor device can be prevented from peeling. The inventors also found that when the sealant laminated composite of the invention is used, the semiconductor devices forming surface of a semiconductor devices forming wafer can be collectively sealed on a wafer level, and after the sealing, a sealant that is excellent in the sealing performance such as the heat resistance and the humidity resistance and very versatile can be obtained, thereby the sealant laminated composite of the invention was completed.

Further, the inventors found that the sealed semiconductor devices mounting substrate and the sealed semiconductor devices forming wafer that are collectively sealed with the sealant laminated composite can be prevented from warping and producing peeled semiconductor devices, and, further, found that by dicing, into each piece, the sealed semiconductor devices mounting substrate and the sealed semiconductor devices forming wafer, in which its warp and the peel of the semiconductor device are prevented, a high quality semiconductor apparatus can be obtained; thereby, the sealed semiconductor devices mounting substrate and the sealed semiconductor devices forming wafer, and the semiconductor apparatus of the invention were completed.

Still further, the inventors found that the semiconductor devices mounting surface or the semiconductor devices forming surface can be readily covered with the sealant laminated composite, the semiconductor devices mounting surface or semiconductor devices forming surface can be collectively sealed by heating and curing an uncured resin layer of the sealant laminated composite, and when the sealed semiconductor devices mounting substrate and the sealed semiconductor devices forming wafer that are sealed with the sealant laminated composite excellent in the sealing performance and suppressed from producing its warp and peeling of the semiconductor devices is diced into each piece, a high quality semiconductor apparatus can be manufactured, thereby the method for manufacturing a semiconductor apparatus of the invention was completed.

The sealant laminated composite of the invention is used to collectively seal the semiconductor devices mounting surface of a substrate on which semiconductor devices are mounted or the semiconductor devices forming surface of a wafer on which semiconductor devices are formed, and includes a support wafer and an uncured resin layer constituted of an uncured thermosetting resin formed on one side of the support wafer.

<Support Wafer>

The support wafer of the invention has no particular restriction on its diameter, thickness, and material, and can be selected in accordance with a substrate or wafer on which semiconductor devices to be sealed are mounted or formed. Further, the difference between the expansion coefficient of the support wafer and that of the substrate or wafer on which semiconductor devices are mounted or formed is preferably 3 ppm or less. More specifically, the difference between the linear expansion coefficients at temperatures ranging from room temperature (25° C.±10° C.) to 200° C. is preferable to be 3 ppm/° C. or less (that is, 0 to 3 ppm/° C.). When the difference between the expansion coefficients is set to 3 ppm or less, the contraction stress when an uncured resin layer described below in more detail is cured can be sufficiently suppressed with the support wafer. Accordingly, even when a large diameter, thin substrate or wafer is sealed with the sealant laminated composite of the invention, the warp of the substrate or wafer and the peeling of the semiconductor device can be more surely suppressed.

As the support wafer, a silicon (Si) wafer, a silicon carbide (SiC) wafer and the like can be used without particular limitation. However, a silicon wafer can be preferably used. In general, since a wafer on which semiconductor devices are mounted or formed is a silicon wafer, when a silicon wafer the same as that is used, the contraction stress when an uncured resin layer is cured can be further suppressed.

Further, in the invention, as the support wafer, a resin-impregnated fiber base material obtained by impregnating a fiber base material with a thermosetting resin composition and the thermosetting resin composition is then semi-cured or cured can be used. Such a resin-impregnated fiber base material has a very small expansion coefficient and the contraction stress when an uncured resin layer detailed below is cured can be suppressed; accordingly, even when a large diameter organic resin substrate, a large diameter substrate such as metal, or a large diameter wafer is sealed with the sealant laminated composite of the invention, the substrate or wafer can be suppressed from warping and the semiconductor device can be suppressed from peeling.

[Fiber Base Material]

As what can be used as the fiber base material, a glass fiber selected from E-glass, S-glass, T-glass and D-glass is preferably used. Further, in general, when a glass fiber other than the above is used, owing to alkali ion components such as sodium contained much therein, the reliability as the sealant is reduced, and owing to the impurities contained much, the electric characteristics may be deteriorated. However, when, like in the invention, an ion trapping agent is contained in at least one of the thermosetting resin composition with which the fiber base material is impregnated and the thermosetting resin composition that constitutes the uncured resin layer, also these fiber base materials can be used. Thereby, even when a semiconductor apparatus having a relatively thick sealing layer exceeding 200 μm is used, a semiconductor apparatus less in warp and high in the reliability can be obtained. Further, as required, other than the glass fiber, a high purity quartz fiber can be used.

As conformations of the fiber base material, sheet-like ones such as a roving in which long fibrous filaments are pulled and aligned in one direction, a fiber cloth and a nonwoven fabric, and a chop-strand matte are exemplified. However, as long as it can form a laminate, there is no particular limitation.

[Thermosetting Resin Composition]

In the sealant laminated composite of the invention, at least one of the thermosetting resin composition with which the fiber base material is impregnated and the thermosetting resin composition that constitutes the uncured resin layer contains an ion trapping agent. In particular, it is desirable that both the thermosetting resin composition with which the fiber base material is impregnated and the thermosetting resin composition that constitutes the uncured resin layer contain an ion trapping agent.

As the ion trapping agent, inorganic substances such as hydrotalcites, zinc molybdate, and rare earth oxides such as lanthanum oxide, and ion exchange resins can be used. As the ion trapping agent, an ion trapping agent that does not adversely affect on the reliability of a semiconductor apparatus is preferably selected without limiting to materials described above.

The above-described components work as an ion trapping agent and effectively trap ionic impurities derived from the fiber base materials such as the glass fiber, ionic impurities intruding from the outside of the semiconductor apparatus, and ionic impurities derived from the semiconductor devices and the semiconductor devices mounting organic substrate. Further, even when the sealing resin layer has a sealing layer of relatively thick, in particular, a thickness more than 200 μm, the ion trapping agent is essential to reduce the warp of the substrate or to achieve high reliability of the semiconductor apparatus.

As the thermosetting resin composition, an epoxy resin, a silicone resin, and an epoxy-silicone mixed resin, described below, that contain hydrotalcites, zinc molybdate, or rare earth oxides such as lanthanum oxide as the ion trapping agent can be exemplified. However, a thermosetting resin that is usually used to seal a semiconductor device can be used without particular limitation.

As a typical ion trapping agent, hydrotalcites represented by the following formula will be described as an example. The hydrotalcites are desirable to be 1 to 10 parts by mass with respect to 100 pats by mass of a sum total of the thermosetting resin and a curing agent. When the hydrotalcites are contained by 1 parts by mass or more, a sufficient impurity trapping capability can be obtained. When the hydrotalcites are contained by 10 parts by mass or less, the impurity trapping capability is sufficient and the humidity resistance reflow property can be suppressed from deteriorating owing to an increase in moisture absorption of the hydrotalcites themselves,

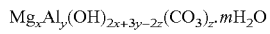

wherein x, y and z each have relationships of $0<y/x\leq1$ and $0\leq z/y<1.5$, and m represents an integer.

Further, when zinc molybdate is used, zinc molybdate is desirably contained by 0.5 parts by mass or more with respect to 100 parts by mass of a sum total of the thermosetting resin and the curing agent. When zinc molybdate is contained by 0.5 parts by mass or more, sufficient impurity trapping capability can be obtained. The upper limit of an addition amount is not particularly limited. However, from the viewpoint of maintaining the adhesiveness and workability, the addition amount is desirable to be 5 to 50% by weight.

Still further, also rare earth oxide such as lanthanum oxide can be used as an ion trapping agent. Among rare earth oxides, lanthanum oxide is desirable.

A use amount of the lanthanum oxide is desirable to be 0.2 to 5 parts by mass with respect to 100 parts by mass of a sum total of the thermosetting resin and the curing agent. When the use amount is 0.2 parts by mass or more, sufficient impurity trapping capability can be obtained. When the use amount is 5 parts by mass or less, the humidity resistance reflow property can be suppressed from deteriorating owing to an increase in the moisture absorption of lanthanum oxide itself.

The ion trapping agents may be used singularly or in a combination of two or more kinds thereof.

[Method for Fabricating Resin-Impregnated Fiber Base Material]

As a method for impregnating a fiber base material with a thermosetting resin composition, both a solvent method and a hot-melt method can be performed. The solvent method is a method where a thermosetting resin composition is dissolved in an organic solvent to fabricate a resin varnish, and, after a fiber base material is impregnated with the resin varnish, the solvent is heated to volatilize. The hot-melt method is a method where a solid thermosetting resin composition is heated and melted to impregnate the fiber base material therewith.

As a method for semi-curing a thermosetting resin composition that is impregnated in the fiber base material, a method for semi-curing by heating the thermosetting resin composition that is impregnated in the fiber base material to desolvate is exemplified without particular limitation. Further, as a method for curing the thermosetting resin composition that is impregnated in the fiber base material, a method for curing by heating the thermosetting resin composition that is impregnated in the fiber base material can be exemplified without particular limitation.

The thickness of the resin-impregnated fiber base material obtained by impregnating the fiber base material with the thermosetting resin composition and further by semi-curing or curing the thermosetting resin composition is determined depending on a thickness of the fiber base material used such as fiber cloth. When a thick resin-impregnated fiber base material is fabricated, the number of sheets of the fiber base material such as the fiber cloth is increased to laminate them.

In the invention, the semi-curing means a B-stage state (a curing-incomplete body of a thermosetting resin composition: a resin in this state is softened when heated, and when brought into contact with a certain solvent, it swells but is not completely melted and dissolved), as defined in JIS K 6800 "Adhesive/Adhesion Terms".

As a thickness of the resin-impregnated fiber base material, in both of the case where the thermosetting resin with which the fiber base material is impregnated is semi-cured and the case where the same is cured, a thickness of 50 µm to 1 mm is preferable and a thickness of 100 µm to 500 µm is more preferable. A thickness of 50 µm or more is preferable since it can suppress deformation caused when the thickness is too small, and a thickness of 1 mm or less is preferable since it can suppress the semiconductor apparatus itself from becoming too thick.

Moreover, the expansion coefficient of the resin-impregnated fiber base material in an X-Y direction at temperatures ranging from room temperature (25° C.±10° C.) to 200° C. is preferably 5 ppm/° C. or more and 30 ppm/° C. or less, and more preferably 10 ppm/° C. or more and 25 ppm/° C. or less.

When the expansion coefficient in an X-Y direction of the resin-impregnated fiber base material is 5 ppm/° C. or more and 30 ppm/° C. or less, the difference of expansion coefficient from that of the substrate on which semiconductor devices are mounted becomes smaller, the warp of the substrate to be sealed and the peeling of the semiconductor devices from the substrate can be more surely suppressed. It is to be noted that the X-Y direction means a plane direction of the resin-impregnated fiber base material, and the expansion coefficient in an X-Y direction means an expansion coefficient measured by arbitrarily setting an X axis and a Y axis in the plane direction of the resin-impregnated fiber base material.

The resin-impregnated fiber base material is important in order to reduce the warp after collective seal of the semiconductor devices mounting surface and to reinforce the substrate having one or more semiconductor devices aligned and bonded thereon. Therefore, a hard and rigid resin-impregnated fiber base material is desirable.

<Uncured Resin Layer>

The sealant laminated composite of the invention has an uncured resin layer. The uncured resin layer is constituted of an uncured thermosetting resin formed on one side of the support wafer. The uncured resin layer serves as a resin layer for sealing.

Further, the thickness of the uncured resin layer depends on the thickness of semiconductor devices that are mounted or formed on the wafer. In order to secure high reliability, the thickness of the sealing resin layer from a top surface of the semiconductor devices (in a vertical direction) is 10 to 2000 µm. From this, usually, the thickness of the uncured resin layer is preferable to be 20 µm or more and 2000 µm or less. When the thickness of the uncured resin layer is 20 µm or more, preferably, a necessary thickness of the sealing resin layer can be secured on the semiconductor devices, and a failure of filling properties and an uneven film thickness owing to an extremely thin thickness can be suppressed from occurring. When the thickness is 2000 µm or less, the thickness of the sealed wafer and semiconductor apparatus is prevented from being too thick to enable high packaging density.

Although the uncured resin layer is not limited in particular, an uncured resin layer constituted of a liquid epoxy resin or a solid epoxy resin, a silicone resin, or a mixed resin of the epoxy resin and the silicone resin, which are generally used for sealing semiconductor devices, is preferable. In particular, it is preferable for the uncured resin layer to contain anyone of the epoxy resin, the silicone resin, and the epoxy-silicone mixed resin that are solidified at a temperature less than 50° C. and molten at a temperature of 50° C. or higher and 150° C. or less. With such an uncured resin layer, the layer can be readily handled, manufactured and used as a sealing agent. Further, since the uncured resin layer is constituted of a thermosetting resin, the upper limit of the melting temperature of the uncured resin layer is desirable to be equal to or less than a temperature at which its reaction starts.

With such an uncured resin layer, a resin-impregnated fiber base material having a very small expansion coefficient can suppress the contraction stress during curing of the uncured resin layer containing these resins. Accordingly, even when a large diameter organic resin substrate, a large diameter substrate such as metal, or a wafer is sealed, the warp of the substrate or wafer and the peeling of the semiconductor devices from the substrate can be surely suppressed. Further, in particular, after sealing, a sealant laminated composite excellent in the sealing properties such as the heat resistance and the humidity resistance can be obtained.

Further, the uncured resin layer is preferable to contain an ion trapping agent such as hydrotalcites, zinc molybdate, or lanthanum oxide, and any one of an epoxy resin, a silicone resin, and an epoxy-silicone mixed resin that are solidified at a temperature less than 50° C. and molten at a temperature that is 50° C. or higher. The upper limit of the melting temperature depends on a reaction of the thermosetting resin composition and a catalyst used and is preferable to be 180° C. or lower.

[Epoxy Resin]

The epoxy resin is not restricted in particular. Examples thereof include: a bisphenol type epoxy resin such as a bisphenol A epoxy resin, a bisphenol F epoxy resin, a 3,3',5,5'-tetramethyl-4,4'-bisphenol type epoxy resin, or a 4,4'-bisphenol type epoxy resin; epoxy resins obtained by hydrogenating an aromatic ring of a phenol novolac-type epoxy resin, a cresol novolac-type epoxy resin, a bisphenol A novolac-type epoxy resin, a naphthalene diol-type epoxy resin, a tris phenylolmethane-type epoxy resin, a tetrakis phenylolethane-type epoxy resin, and a phenol dicyclopentadiene novolac-type epoxy resin; and a known epoxy resin that is liquid or solid at room temperature such as an alicyclic epoxy resin. Moreover, as required, a predetermined amount of other epoxy resin other than those described above can be also used together.

Since the uncured resin layer constituted of the epoxy resin serves as the resin layer that seals the semiconductor devices, it is preferable to reduce halogen ions such as chlorine and alkali ions such as sodium as much as possible. When a sample of 10 g is added to 50 ml of ion-exchange water, the solution is sealed and left to stand still in an oven at 120° C. for 20 hours, and ions are extracted at 120° C. under heating, any of extracted ions is desirable to be 10 ppm or less.

A curing agent for epoxy resins can be contained in the uncured resin layer constituted of the epoxy resin. As the curing agent, it is possible to use, for example, a phenol novolac resin, various kinds of amine derivatives, an acid anhydride, or a curing agent obtained by partially ring opening an acid anhydride or an acid anhydride group to thereby generate a carboxylic acid. Among these, the phenol novolac resin is desirably used to secure reliability of the semiconductor apparatus manufactured using the sealant laminated composite according to the invention. In particular, it is preferable to mix the epoxy resin and the phenol novolac resin such that a mixing ratio of epoxy groups and phenolic hydroxyl groups is 1:0.8 to 1.3.

Additionally, to promote a reaction of the epoxy resin and the curing agent, as an reaction promoter, an imidazole derivative, a phosphine derivative, an amine derivative, or a metal compound such as an organic aluminum compound may be used, for example.

Various kinds of additives may be blended in the uncured resin layer constituted of the epoxy resin as required. For example, for the purpose of improving properties of the resin, it is possible to add and blend additives such as various kinds of thermoplastic resins, thermoplastic elastomers, organic synthetic rubbers, silicon-based low-stress agents, waxes, and halogen trapping agents.

[Silicone Resin]

As the silicone resin, a thermosetting silicone resin and others can be used. In particular, it is desirable for the uncured resin layer constituted of the silicone resin to contain an addition-curable silicone resin composition. As the addition-curable silicone resin composition, a composition having (A) an organosilicon compound having a non-conjugated double bond, (B) organohydrogenpolysiloxane, and (C) a platinum-based catalyst as essential components is particularly preferable. The components (A) to (C) will be described hereinafter.

Component (A): Organosilicon Compound Having Non-Conjugated Double Bond

As the (A) organosilicon compound having a non-conjugated double bond is exemplified by organopolysiloxane represented by a general formula (1),

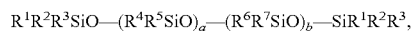

wherein $R^1$ represents a non-conjugated double bond-containing univalent hydrocarbon group, $R^2$ to $R^7$ each represent the same or different univalent hydrocarbon group, and a and b represent integers meeting $0 \leq a \leq 500$, $0 \leq b \leq 250$, and $0 \leq a+b \leq 500$.

In the general formula (1), $R^1$ is a non-conjugated double bond-containing univalent hydrocarbon group, which is preferably a non-conjugated double bond-containing univalent hydrocarbon group having an aliphatic unsaturated bond as typified preferably by a $C_2$ to $C_8$ alkenyl group, particularly preferably by a $C_2$ to $C_6$ alkenyl group.

In the general formula (1), $R^2$ to $R^7$ each are the same or different univalent hydrocarbon groups and exemplified preferably by a $C_1$ to $C_{20}$, particularly preferably $C_1$ to $C_{10}$ alkyl group, alkenyl group, aryl group, or aralkyl group. Further, among these, $R^4$ to $R^7$ each are more preferably a univalent hydrocarbon group excluding an aliphatic unsaturated bond, particularly preferably an alkyl group, an aryl group, or an aralkyl group that does not have an aliphatic unsaturated bond such as an alkenyl group. Furthermore, among these, $R^6$ and $R^7$ each are preferably an aromatic univalent hydrocarbon group, more preferably, a $C_6$ to $C_{12}$ aryl group such as a phenyl group or a tolyl group.

In the general formula (1), a and b are integers meeting $0 \leq a \leq 500$, $0 \leq b \leq 250$, and $0 \leq a+b \leq 500$, and a preferably satisfies $10 \leq a \leq 500$, b preferably satisfies $0 \leq b \leq 150$, and a+b preferably satisfies $10 \leq a+b \leq 500$.

The organopolysiloxane represented by the general formula (1) can be obtained by an alkali equilibration reaction between a cyclic diorganopolysiloxane such as a cyclic diphenylpolysiloxane or a cyclic methylphenylpolysiloxane and a disiloxane such as a diphenyltetravinyldisiloxane or a divinyltetraphenyldisiloxane, which constitutes a terminal group. However, in this case, since a small amount of a catalyst irreversibly advances polymerization in the equilibration reaction using an alkali catalyst (particularly strong alkali such as KOH), ring-opening polymerization alone quantitatively proceeds, a terminal blocking ratio is high, and hence a silanol group and a chloride component are not usually contained.

Organopolysiloxanes represented by the general formula (I) are specifically exemplified by the following expression,

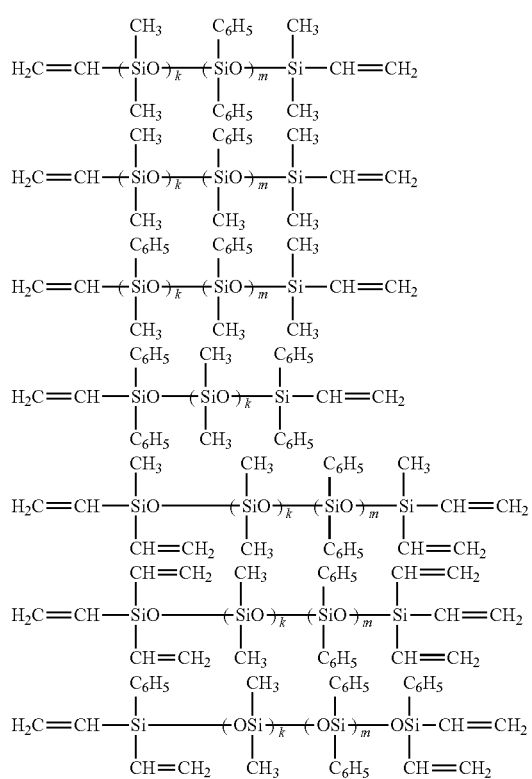

wherein k and m each represent an integer satisfying 0≤k≤500, 0≤m≤250, and 0≤k+m≤500, preferably 5≤k+m≤250, and 0≤m/(k+m)≤0.5.

As the component (A), other than organopolysiloxanes having a straight-chain structure represented by the general formula (1), as required, also organopolysiloxanes having a three-dimensional network structure including a trifunctional siloxane unit, a tetrafunctional siloxane unit, and the like can be used. The organosilicon compounds having a non-conjugated double bond (A) may be used singularly or in a combination of two or more kinds thereof.

It is preferable for an amount of a group (univalent hydrocarbon group having a double bond bonded to a Si atom) having a non-conjugated double bond in the organosilicon compound having a non-conjugated double bond (A) to be 1 to 50% by mol in all univalent hydrocarbon groups (all univalent hydrocarbon groups bonded to Si atoms), more preferable to be 2 to 40% by mol, particularly preferable to be 5 to 30% by mol. An excellent cured material can be obtained at the time of curing when an amount of the group having the non-conjugated double bond is 1% by mol or more, and mechanical characteristics thereof are excellent at the time of curing when the same is 50% by mol or less, which is preferable.

Furthermore, it is preferable for the organosilicon compound having a non-conjugated double bond (A) to have an aromatic univalent hydrocarbon group (an aromatic univalent hydrocarbon group bonded to a Si atom), and it is preferable for the content of the aromatic univalent hydrocarbon group to be 0 to 95% by mol in all univalent hydrocarbon groups (all univalent hydrocarbon groups bonded to Si atoms), more preferable to be 10 to 90% by mol, and particularly preferable to be 20 to 80% by mol. When an appropriate amount of the aromatic univalent hydrocarbon group is contained in the resin, an advantage that mechanical characteristics at the time of curing are excellent and manufacture can be well performed is obtained.

Component (B): Oranohydrogenpolysiloxane

As the component (B), organohydrogenpolysiloxanes having two or more hydrogen atoms bonded to silicon atoms (SiH groups) in one molecule are preferable. The organohydrogenpolysiloxanes having two or more hydrogen atoms bonded to silicon atoms (SiH groups) in one molecule can serves as a cross-linker, and a cured material can be formed by an additional reaction of the SiH group in the component (B) and the non-conjugated double bond-containing group such as a vinyl group or an alkenyl group in the component (A).

Moreover, it is preferable for the organohydrogenpolysiloxane (B) to have an aromatic univalent hydrocarbon group. With the organohydrogenpolysiloxane (B) having the aromatic univalent hydrocarbon group like this, compatibility with the component (A) can be enhanced. The organohydrogenpolysiloxanes (B) can be used singularly or in a mixture of two or more kinds thereof, and organohydrogenpolysiloxane (B) having an aromatic hydrocarbon group, for example, can be contained as a part or all of the component (B).

Although not restricted, examples of the organohydrogenpolysiloxanes (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy) phenylsilane, 1-glysidoxypropyl-1,3,5,7-tetramethylcyclotetrasiloxane, 1,5-glysidoxypropyl-1,3,5,7-tetramethylcyclotetrasiloxane, 1-glysidoxypropyl-5-trimethoxysilylethyl-1,3,5,7-tetrameth ylcyclotetrasiloxane, double-ended trimethylsiloxy group blocked methylhydrogenpolysiloxane, a double-ended trimethylsiloxy group blocked dimethylsiloxane/methylhydrogensiloxane copolymer, double-ended dimethylhydrogensiloxy group blocked dimethylpolysiloxane, a double-ended dimethylhydrogensiloxy group blocked dimethylsiloxane/methylhydrorgensiloxane copolymer, a double-ended trimethylsiloxy group blocked methylhydrogensiloxane/diphenylsiloxane copolymer, a double-ended trimethylsiloxy group blocked methylhydrogensiloxane/diphenylsiloxane/dimethylsiloxane copolymer, a trimethoxysilane polymer, a copolymer constituted of $(CH_3)_2HSiO_{1/2}$ units and $SiO_{4/2}$ units, and a copolymer constituted of $(CH_3)_2HSiO_{1/2}$ units, $SiO_{4/2}$ units, and $(C_6H_5)SiO_{3/2}$ units.

Further, also organohydrogenpolysiloxanes obtained by using units represented by the following structures can be used.

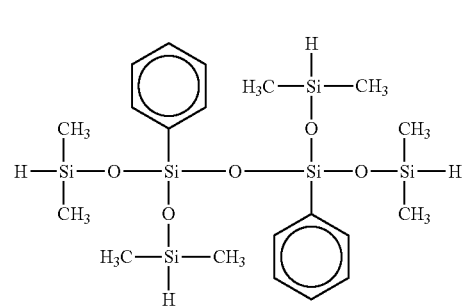

-continued

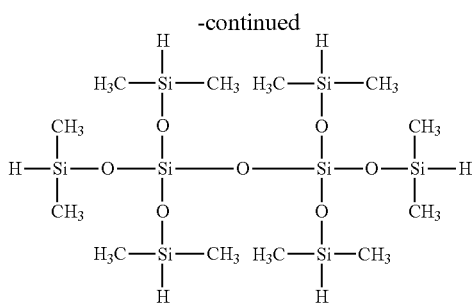

Further, as the organohydrogenpolysiloxanes (B), the following can be given.

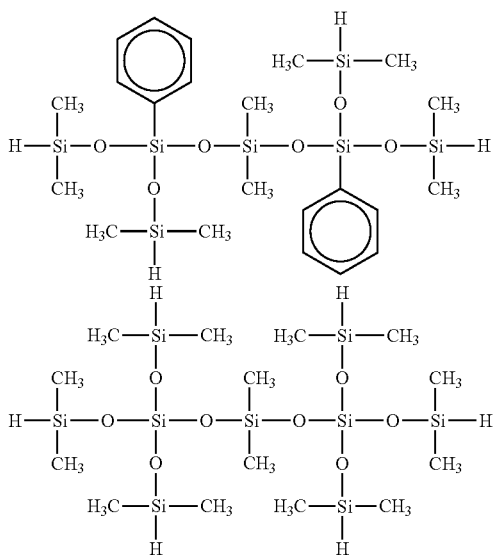

A molecular structure of the organohydrogensiloxanes (B) may be any one of a straight chain structure, a cyclic structure, a branched chain structure and a three-dimensional network structure. However, the number of silicon atoms in one molecule (or the degree of polymerization in the case of a polymer) is preferable to be two or more, more preferable to be 2 to 1,000, and particularly preferable to be 2 to about 300.

A compounding amount of the organohydrogenpolysiloxane (B) is preferable to be an amount for hydrogen atoms bonded to silicon atoms (SiH group) in the component (B) per group having a non-conjugated double bond such as an alkenyl group of the component (A) to be 0.7 to 3.0.

Component (C): Platinum-Based Catalyst

As the component (C), a platinum-based catalyst is used. As the platinum-based catalyst (C), for example, chloroplatinic acid, alcohol-modified chloroplatinic acid, and a platinum complex having a chelate structure can be cited. These can be used singularly or in a combination of two or more kinds thereof.

A compounding amount of the platinum-based catalyst (C) may be a curing effective amount, that is, a so-called catalyst amount, and is usually preferable to be in the range of 0.1 to 500 ppm, in particular, 0.5 to 100 ppm in terms of weight of platinum group metal per 100 parts by mass of a total amount of the (A) component and (B) component.

The uncured resin layer constituted of the silicone resin becomes a resin layer for sealing semiconductor devices. Accordingly, it is preferable for ions of halogen such as chlorine and ions of alkali such as sodium are reduced as much as possible. Usually, it is desirable for any of ions to be 10 ppm or less when extracted at 120° C.

[Mixed Resin Constituted of Epoxy Resin and Silicone Resin]

As an epoxy resin and a silicone resin contained in the mixed resin, the epoxy resins and the silicone resins described above can be cited.

The uncured resin layer constituted of the mixed resin becomes a resin layer for sealing semiconductor devices. Accordingly, it is preferable for ions of halogen such as chlorine and ions of alkali such as sodium are reduced as much as possible. Usually, it is desirable for any of ions to be 10 ppm or less when extracted at 120° C.

[Inorganic Filler]

In the uncured resin layer related to the invention, an inorganic filler can be compounded. Examples of the inorganic fillers being compounded include silicas such as fused silica and crystalline silica, alumina, silicon nitride, aluminum nitride, aluminosilicate, boron nitride, glass fiber and antimony trioxide. An average particle size and a shape thereof are not particularly limited.

As the inorganic filler to be added to the uncured resin layer constituted of an epoxy resin in particular, in order to enhance the bonding strength between the epoxy resin and the inorganic filler, an inorganic filler that was treated in advance with a coupling agent such as a silane coupling agent or a titanate coupling agent may be blended.

Examples of such the coupling agents include: epoxy functionalized alkoxysilanes such as γ-glycidoxypropyltrimethoxysilane, γ-glycidoxypropylmethyldiethoxysilane, and β-(3,4-epoxycyclohexyl)ethyltrimethoxysilane; amino functionalized alkoxysilane such as N-β(aminoethyl)-γ-aminopropyltrimethoxysilane, γ-aminopropyltriethoxysilane, and N-phenyl-γ-aminopropyltrimethoxysilane; and mercapto functionalized alkoxysilane such as γ-mercaptopropyltrimethoxysilane. It is to be noted that a compounding amount of the coupling agent used for a surface treatment and a surface treatment method are not restricted in particular.

Also when adding to the uncured resin layer constituted of the silicone resin composition, a material obtained by surface treating the inorganic filler with the above-described coupling material may be blended.

A compounding amount of the inorganic filler is preferably 100 to 1300 parts by mass and particularly preferably 200 to 1000 parts by mass with respect to 100 parts by mass as a total weight of a resin in the epoxy resin composition or the silicone resin composition. When 100 parts by mass or more are added, sufficient strength can be obtained, and when 1300 parts by mass or less are added, a reduction in flowability due to thickening and also a failure of filling properties due to a reduction in flowability can be suppressed, whereby the semiconductor devices formed on the wafer and the semiconductor devices arranged and mounted on the substrate can be excellently sealed. It is preferable for the inorganic filler to be added in the range of 50 to 95% by weight or especially 60 to 90% by weight in the entire composition constituting the uncured resin layer.

<Sealant Laminated Composite>

FIG. 1 shows an example of a cross-sectional view of a sealant laminated composite according to the invention. The sealant laminated composite 10 according to the invention has the support wafer 1, and the uncured resin layer 2 constituted of an uncured thermosetting resin formed on one side of the support wafer.

[Method for Fabricating Sealant Laminated Composite]

When fabricating the sealant laminated composite according to the invention, an uncured resin layer that is solid at 50° C. or less can be formed by coating a thermosetting resin such as a liquid epoxy resin or a silicone resin on one side of a support wafer by printing or dispensing under reduced pressure or vacuum and by heating.

Further, an uncured resin layer can be formed according to various methods that have been used in a conventional epoxy thermosetting resin or a conventional silicone thermosetting resin such as press molding or printing an uncured thermosetting resin on one side of the support wafer.

As another method for forming the uncured thermosetting resin layer on one side of the support wafer, a method where an epoxy thermosetting resin or a silicone thermosetting resin that is solid at room temperature is pressurized under heating, or a method where an epoxy resin composition that is liquefied by adding an appropriate amount of a polar solvent such as acetone is printed to form a thin film, and the solvent is removed by heating under reduced pressure to uniformly form an uncured resin layer on one side of the support wafer can be used.

According to any of the methods, on one side of the support wafer, an uncured resin layer constituted of an uncured thermosetting resin that is free of voids and volatile components and has a thickness of 20 to 2000 µm or so can be formed.

[Substrate on which Semiconductor Devices are Mounted or Wafer on which Semiconductor Devices are Formed]

Figure 2:
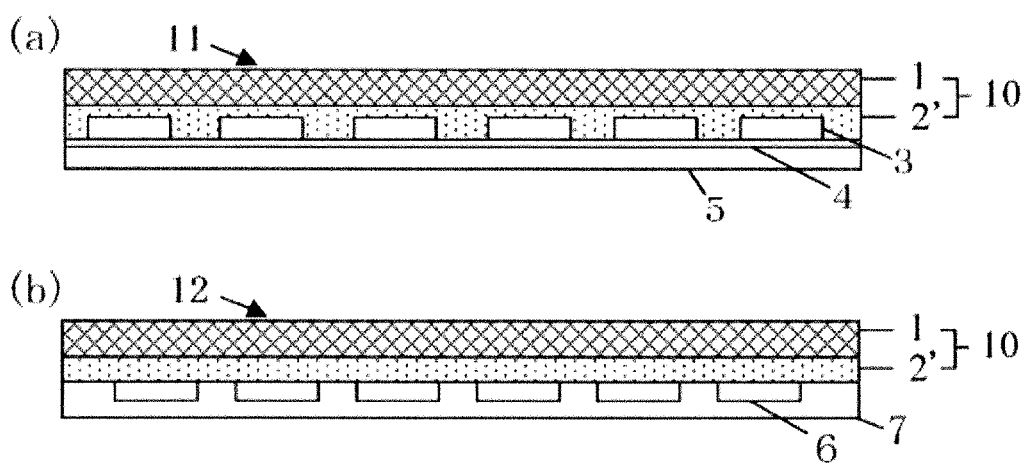
FIG. 2 is an example of a cross-sectional view of (a) a sealed semiconductor devices mounting substrate and (b) a sealed semiconductor devices forming wafer that are sealed with the sealant laminated composite of the invention.

The sealant laminated composite according to the invention is a sealant laminated composite for collectively sealing the semiconductor devices mounting surface of the substrate on which the semiconductor devices are mounted and the semiconductor devices forming surface of the wafer on which the semiconductor devices are formed. As the wafer used here, a silicon (Si) wafer and a SiC wafer are general, and, particularly, a silicone wafer is preferable. As an example of the substrate on which the semiconductor devices are mounted, the substrate 5 on which one or more semiconductor devices 3 are mounted on through an adhesive 4 shown in FIG. 2A can be given, and as an example of the substrate, a BT (bismaleimidetriazine) resin organic substrate can be given. Further, as an example of the wafer on which the semiconductor devices are formed, the wafer 7 on which the semiconductor devices 6 are formed shown in FIG. 2B can be given. It is to be noted that examples of the substrate on which the semiconductor devices are mounted include a wafer on which semiconductor devices are mounted and aligned in multi-layer.

<Sealed Semiconductor Devices Mounting Substrate and Sealed Semiconductor Devices Forming Wafer>

FIGS. 2A and 2B show examples of cross-sectional views of the sealed semiconductor devices mounting substrate and the sealed semiconductor devices forming wafer, which are sealed with the sealant laminated composite according to the invention. In the sealed semiconductor devices mounting substrate 11 according to the invention, the semiconductor devices mounting surface of the substrate 5 on which the semiconductor devices 3 are mounted is covered with the uncured resin layer 2 (see FIG. 1) of the sealant laminated composite 10, the uncured resin layer 2 (see FIG. 1) is heated and cured to provide a cured resin layer 2' and the semiconductor devices mounting surface is collectively sealed with the sealant laminated composite 10 (FIG. 2A). Furthermore, in the sealed semiconductor devices forming wafer 12 according to the invention, the semiconductor devices forming surface of the wafer 7 on which the semiconductor devices 6 are formed is covered with the uncured resin layer 2 (see FIG. 1) of the sealant laminated composite 10, the uncured resin layer 2 (see FIG. 1) is heated and cured to provide the cured resin layer 2', and the semiconductor devices forming surface is collectively sealed with the sealant laminated composite 10 (FIG. 2B).

The sealed semiconductor devices mounting substrate or the sealed semiconductor devices forming wafer is prevented from warping and the semiconductor devices mounting thereon are prevented from peeling.

<Semiconductor Apparatus>

Figure 3:
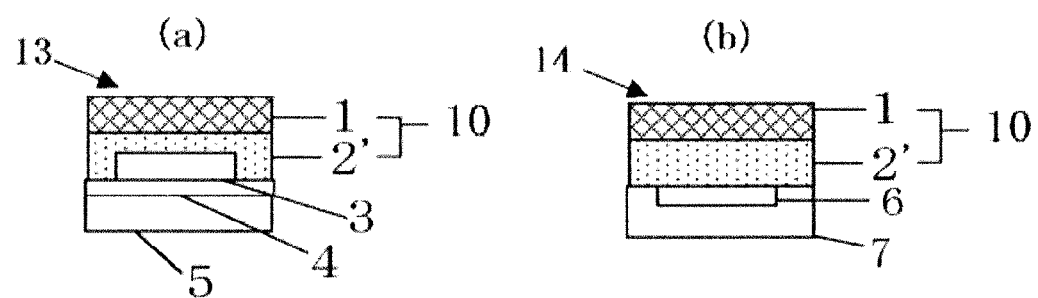
FIG. 3 is an example of a cross-sectional view of (a) a semiconductor apparatus of the invention manufactured from a sealed semiconductor devices mounting substrate, and (b) a semiconductor apparatus of the invention manufactured from a sealed semiconductor devices forming wafer.

FIGS. 3A and 3B show examples of a semiconductor apparatus according to the invention. The semiconductor apparatus 13 according to the invention is obtained by dicing the sealed semiconductor devices mounting substrate 11 (see FIG. 2) or the sealed semiconductor devices forming wafer 12 (see FIG. 2) into each piece. As described above, the semiconductor apparatus 13 or 14 that is manufactured by dicing, into each piece, the sealed semiconductor devices mounting substrate 11 (see FIG. 2) or the sealed semiconductor devices forming wafer 12 (see FIG. 2) that is sealed with the sealant laminated composite having excellent sealing performance such as heat resistance or moisture resistance and suppressed from producing its warp and semiconductor devices 3 peeled from the substrate can be a high-quality semiconductor apparatus. When the sealed semiconductor devices mounting substrate 11 (see FIG. 2A) is diced into each piece, the semiconductor apparatus 13 can be a semiconductor apparatus (FIG. 3A) that has the semiconductor devices 3 mounted on the substrate 5 through the adhesive 4 and is sealed with the sealant laminated composite 10 including the cured resin layer 2' and the support wafer 1 from above (FIG. 3A). Furthermore, when the sealed semiconductor devices forming wafer 12 (see FIG. 2B) is diced into each piece, the semiconductor apparatus 14 can be a semiconductor apparatus that has the semiconductor devices 6 formed on the wafer 7 and is sealed with the sealant laminated composite 10 including the cured resin layer 2' and the support wafer 1 from above (FIG. 3B).

<Method for Manufacturing Semiconductor Apparatus>

Figure 4:
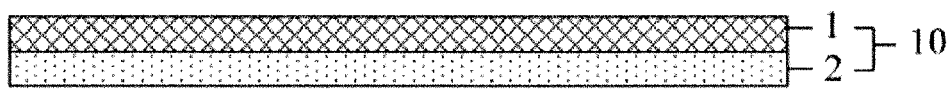
FIG. 4 is an example of a flow-chart of a method for manufacturing a semiconductor apparatus from a substrate on which semiconductor devices are mounted by using a sealant laminated composite of the invention.
Figure 4:
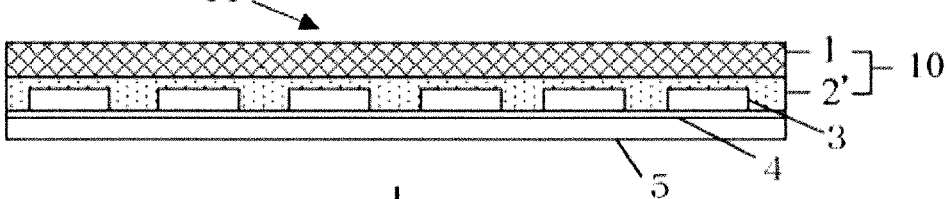
Figure 4:
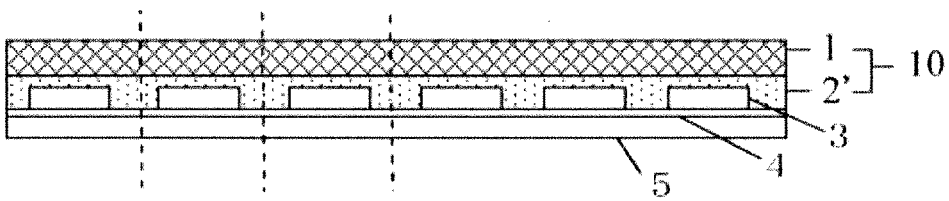
Figure 4:
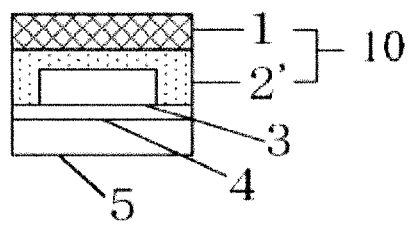

The method for manufacturing a semiconductor apparatus of the invention includes a covering step of covering the semiconductor devices mounting surface of a substrate on which semiconductor devices are mounted or the semiconductor devices forming surface of a wafer on which semiconductor devices are formed with the uncured resin layer of the sealant laminated composite, a sealing step of collectively sealing the semiconductor devices mounting surface or the semiconductor devices forming surface by heating and curing the uncured resin layer to form a sealed semiconductor devices mounting substrate or a sealed semiconductor devices forming wafer, and a step of dicing the sealed semiconductor devices mounting substrate or the sealed semiconductor devices forming wafer into each piece to manufacture the semiconductor apparatus. Hereinafter, the method for manufacturing a semiconductor apparatus of the invention will be described with reference to FIG. 4.

[Covering Step]

The covering step of the method for manufacturing a semiconductor apparatus of the invention is a step of covering the semiconductor devices mounting surface of the substrate 5 on which the semiconductor devices 3 are mounted through the adhesive 4, or the semiconductor devices forming surface of the wafer (not shown) on which the semiconductor devices (not shown in the drawing) are formed with the uncured resin layer 2 of the sealant laminated composite 10 having the support wafer 1 and the uncured resin layer 2 (FIG. 4A).

[Sealing Step]

The sealing step of the a method for manufacturing a semiconductor apparatus of the invention is a step where to provide the cured resin layer 2', the semiconductor devices mounting surface of the substrate 5 on which the semiconductor devices 3 are mounted or the semiconductor devices forming surface of the wafer (not shown in the drawing) on which the semiconductor devices (not shown in the drawing) are formed are collectively sealed by heating and curing an uncured resin layer 2 of the sealant laminated composite 10, thereby a sealed semiconductor devices mounting substrate 11 or a sealed semiconductor devices forming wafer (not shown in the drawing) is provided (FIG. 4B).

[Dicing Step]

The dicing step of the method for manufacturing a semiconductor apparatus of the invention is a step of dicing the sealed semiconductor devices mounting substrate 11 or the sealed semiconductor devices forming wafer (not shown in the drawing) into each piece to manufacture the semiconductor apparatus 13 or 14 (see FIG. 3B) (FIG. 4C, 4D).

Hereinafter, more specific description will be given. At the covering step and the sealing step, when a vacuum lamination apparatus for use in lamination of a solder resist film or various kinds of insulator films is used, covering and sealing without void and warp can be carried out. As a method of lamination, it is possible to use any method of roll lamination, diaphragm type vacuum lamination, and air-pressure lamination. Among these, using both the vacuum lamination and the air-pressure lamination is preferable.

Other than the above, compression molding can be used for manufacture. Also in the molding according to the compression molding, when by molding under reduced pressure conditions such as vacuum molding, failure such as voids and unfilling can be prevented from occurring.

Here, description will be given as to an example of using the vacuum lamination apparatus manufactured by Nichigo-Morton Co., Ltd. to seal a silicon wafer having a thickness of 200 μm, a diameter of 300 mm (12 inches) and semiconductors formed thereon with the sealant laminated composite having an uncured resin layer constituted of a uncured thermosetting silicone resin having a thickness of 200 on one side of a silicone wafer having a thickness of 150 μm and a diameter of 300 mm (12 inches).

Of plates that have upper and lower built-in heaters and are set to 150° C., the upper plate has a diaphragm rubber pressed against the heater under reduced pressure. A silicon wafer having a thickness of 200 μm and a diameter of 300 mm (12 inches) is set on the lower plate, and, the sealant laminated composite is set on one side of this silicon wafer so that the uncured resin layer surface can fit to the semiconductor devices forming surface of the silicon wafer. Then, the lower plate is moved up, the upper and lower plates are closely attached to each other to form a vacuum chamber by an O-ring installed so as to surround the silicon wafer set on the lower plate, and pressure in the vacuum chamber is reduced. When the pressure in the vacuum chamber is sufficiently reduced, a valve of a pipe communicating with a vacuum pump from a space between the diaphragm rubber of the upper plate and the heater is closed to send compressed air. As a result, the upper diaphragm rubber inflates to sandwich the semiconductor forming silicon wafer and the sealant laminated composite between the upper diaphragm rubber and the lower plate, and vacuum lamination and curing of the thermosetting silicone resin simultaneously advance, and sealing is completed. A curing time of approximately 3 to 20 minutes is enough. When the vacuum lamination is terminated, the pressure in the vacuum chamber is restored to a normal pressure, the lower plate is moved down, and the sealed silicon wafer laminate is taken out. The wafer without void or warp can be sealed by the above-described process. The taken-out silicon wafer laminate is usually subjected to post cure at a temperature of 150 to 180° C. for 1 to 4 hours, thereby electrical characteristics or mechanical characteristics can be stabilized.

The covering and sealing steps using the vacuum lamination apparatus are not restricted to the illustrated silicone resin, and they can be also used for the epoxy resin or a mixed resin of epoxy and silicone.

According to such a method for manufacturing a semiconductor apparatus, the semiconductor devices mounting surface or the semiconductor devices forming surface can be easily covered with the uncured resin layer of the sealant laminated composite without a filling failure at the covering step. Further, since the laminate is used, the support wafer can suppress the contraction stress of the uncured resin layer at the time of curing, the semiconductor devices mounting surface or the semiconductor devices forming surface can be thereby collectively sealed at the sealing step, and the sealed semiconductor devices mounting substrate or the sealed semiconductor devices forming wafer, in which the warp of the substrate or wafer and the peeling of the semiconductor devices from the substrate are suppressed, can be obtained even though a large diameter, thin wafer or substrate is sealed. Furthermore, at the dicing step, a semiconductor apparatus can be obtained by dicing, into each piece, the sealed semiconductor devices mounting substrate or the sealed semiconductor devices forming wafer that is sealed with the sealant laminated composite that is excellent in the sealing performance such as heat resistance and humidity resistance and is suppressed in warp; thus, the method for manufacturing a semiconductor apparatus can manufacture a high quality semiconductor apparatus.

EXAMPLES

Hereinafter, with reference to a synthesis example of a silicone resin used as an uncured resin layer of a sealant laminated composite of the invention and examples and comparative examples of a method for manufacturing a semiconductor apparatus that uses a sealant laminated composite of the invention, the invention will be more detailed. However, the invention is not limited thereto.

Synthesis of Organosilicon Compound Having Non-Conjugated Double Bond

Synthesis Example 1

Organosilicon Compound Having Non-Conjugated Double Bond (A1)

To synthesize an organosilicon compound having a non-conjugated double bond (A1), 27 mol of organosilane represented as $PhSiCl_3$, 1 mol of $ClMe_2SiO(Me_2SiO)_{33}SiMe_2Cl$, and 3 mol of $MeViSiCl_2$ were dissolved in a toluene solvent, dropped into wafer, co-hydrolyzed, rinsed, neutralized by alkali cleaning, and dehydrated, and then the solvent was stripped. A composition ratio of constituent units of this compound is represented by an expression: $[PhSiO_{3/2}]_{0.27}[-SiMe2_o-(Me_2SiO)_{33}-SiMe_2O-]_{0.01}[MeViSiO_{2/2}]_{0.03}$. A weight-average molecular weight of this compound was 62,000, and a melting point thereof was 60° C. It is to be noted that Vi in the composition formula represents a vinyl group represented by (—CH=CH$_2$), and Me, Ph respectively represent a methyl group and a phenyl group (hereinafter, the same as the above).

Synthesis of Organohydrorgenpolysiloxane

Synthesis Example 2

Organohydrogenpolysiloxane (B1)

To synthesize an organohydrorgenpolysiloxane (B1), 27 mol of organosilane represented as PhSiCl$_3$, 1 mol of ClMe$_2$SiO(Me$_2$SiO)$_{33}$SiMe$_2$Cl, and 3 mol of MeHSiCl$_2$ were dissolved in a toluene solvent, dropped into water, co-hydrolyzed, rinsed, neutralized by alkali cleaning, and dehydrated, and then the solvent was stripped. A composition ratio of constituent units of this resin is represented by an expression: [PhSiO$_{3/2}$]$_{0.27}$[—SiMe$_2$O-(Me$_2$SiO)$_{33}$—SiMe$_2$O-]$_{0.01}$ [MeHSiO$_{2/2}$]$_{0.03}$. A weight-average molecular weight of this compound was 58,000, and a melting point of the same was 58° C.

Example 1

[Fabrication of Composition for Forming Uncured Resin Layer Constituted of Uncured Thermosetting Resin]

With respect to a composition in which 50 parts by mass of the organosilicon compound having a non-conjugated double bond (A1), 50 parts by mass of organohydrogenpolysiloxane (B1), 0.2 parts by mass of acetylene alcohol-based ethynylcyclohexanol as a reaction inhibitor, and 0.1 parts by mass of an octyl alcohol-modified solution of a chloroplatinic acid were added, 350 parts by mass of spherical silica having an average particle size of 5 μm were added at 60° C. and well agitated by a planetary mixer heated to 60° C. to fabricate a silicone resin composition (I-a). The composition was solid at room temperature (25° C.).

[Fabrication of Sealant Laminated Composite]

The silicone resin composition (I-a) was sandwiched between a silicon wafer (support wafer) having a diameter of 300 mm (12 inches) and a fluororesin-coated PET film (release film) and compression molded for 5 min under pressure of 5 ton at 80° C. using a heat press machine, thereby a sealant laminated composite (I-b) where an uncured resin layer constituted of an uncured thermosetting resin having a thickness of 50 μm is formed on one side of a silicon wafer (support wafer) was fabricated.

[Covering and Sealing of Wafer on which Semiconductor Devices are Formed]

Then, a vacuum lamination apparatus (manufactured by Nichigo-Morton Co., Ltd.) of which plate temperature was set to 130° C. was used to perform covering and sealing. First, a silicon wafer that has a diameter of 300 mm (12 inches), a thickness of 125 μm and semiconductor devices formed thereon was set on a lower plate, covered with the silicone resin composition (I-a) surface that is the uncured resin layer of the sealant laminated composite (I-b) from which the release film was removed such that the composition surface fitted to a silicon wafer surface. Thereafter, the plate was closed and vacuum compression molding was performed for 5 min to cure and seal. After curing and sealing, a silicon wafer that was sealed with the sealant laminated composite (I-b) was further subjected to post cure at 150° C. for 2 hr, thereby a sealed semiconductor devices forming wafer (I-c) was obtained.

Example 2

[Substrate on which Semiconductor Devices are Mounted]

On a 200 μm-thick silicon wafer having a diameter of 300 mm (12 inches), through an adhesive of which adhesion force deteriorates at a high temperature, 400 pieces of silicon chips (shape: 5 mm×7 mm, thickness: 125 μm) were arranged and mounted.

[Fabrication of Composition for Forming Uncured Resin Layer Constituted of Uncured Thermosetting Resin]

After thoroughly mixing 60 parts by mass of cresol novolak type epoxy resin (trade name: EOCN 1020, manufactured by Nippon Kayaku Co., Ltd.), 30 parts by mass of phenol novolak resin (trade name: H-4, manufactured by Gun Ei Chemical Industry Co., Ltd.), 400 parts by mass of spherical silica (manufactured by Tatumori Ltd., average particle size: 7 μm), 0.2 parts by mass of catalyst TPP (triphenylphosphine, manufactured by Hokko Chemical Industry Co., Ltd.) and 0.5 parts by mass of a silane coupling agent (trade name: KBM403, manufactured by Shin-Etsu Chemical Co., Ltd.) with a high-speed mixer, the mixture was heated and kneaded with a continuous kneader to form it into a sheet, and then cooled. The sheet was pulverized and thereby an epoxy resin composition (II-a) as a granular powder was obtained.

[Fabrication of Sealant Laminated Composite]

A silicon wafer (support wafer) having a diameter of 300 mm (12 inches) was set on a lower metal mold of a compression molding machine capable of heating and pressurizing under reduced pressure, and a granular powder of the epoxy resin composition (II-a) was uniformly dispersed on the wafer. The temperature of upper and lower metal molds was set to 80° C., a fluororesin-coated PET film (release film) was set on the upper metal mold, the inside of the metal mold was depressurized to a vacuum level, and compression molding was performed for 3 min so that a resin thickness on the silicon wafer (support wafer) was 300 μm, thereby a sealant laminated composite (II-b) was fabricated.

[Covering and Sealing of Substrate on which Semiconductor Devices are Mounted]

Next, a vacuum lamination apparatus (manufactured by Nichigo-Morton Co., Ltd.) of which a plate temperature was set to 170° C. was used to perform covering and sealing. First, a substrate on which semiconductor devices are mounted was set on a lower plate, and covered with the epoxy resin composition (II-a) surface that is an uncured resin layer of the sealant laminated composite (II-b) from which the release film was removed such that the composition surface fitted to the semiconductor devices mounting surface of the semiconductor devices mounting silicon wafer. The plate was then closed and vacuum compression molding was performed for 5 min to cure and seal. After curing and sealing, post cure was performed at 170° C. for 4 hours and a sealed semiconductor devices mounting substrate (II-c) was obtained.

Comparative Example 1

[Fabrication of Sealing Sheet]

A silicone resin composition (I-a) fabricated in the same manner as that of Example 1 was sandwiched between a PET film (base film for pressurizing) and a fluororesin-coated PET film (release film), compression molded for 5 min under pressure of 5 ton at 80° C. using a hot press machine to mold into a film having a thickness of 50 μm, thereby a sealing sheet (III-b) constituted of only the silicone resin composition (I-a) was fabricated. After molding, the sheet was cut into a disc having a diameter of 300 mm (12 inches).

[Covering and Sealing of Wafer on which Semiconductor Devices are Formed]

Next, a vacuum lamination apparatus (manufactured by Nichigo-Morton Co., Ltd.) of which a plate temperature was set to 130° C. was used to perform covering and sealing. First, a silicon wafer having a diameter of 300 mm (12 inches) and a thickness of 125 μm and semiconductor devices formed thereon was set on a lower plate, and stacked with the sealing sheet (III-b) constituted of only the silicone resin composition (I-a) from which the release film was removed. After peeling the PET film (base film for pressurizing), the plate was closed and vacuum compression molding was performed for 5 min to cure and seal. After curing and sealing, post cure was performed at 150° C. for 2 hours, thereby a sealed semiconductor devices forming wafer (III-c) was obtained.

Comparative Example 2

[Substrate on which Semiconductor Devices are Mounted]

On a 200 μm-thick silicon wafer having a diameter of 300 mm (12 inches), through an adhesive of which adhesion force deteriorates at a high temperature, 400 of pieces of silicon chips (shape: 5 mm×7 mm, thickness: 125 μm) were arranged and mounted.

[Covering and Sealing of Substrate on which Semiconductor Devices are Mounted]

A substrate on which the semiconductor devices are mounted was set on a lower metal mold of a compression molding machine capable compression molding under reduced pressure, and a granular powder of the epoxy resin composition (II-a) fabricated in the same manner as that of Example 2 was uniformly dispersed. The temperature of upper and lower metal molds was set to 170° C., a fluororesin-coated PET film (release film) was set on the upper metal mold and the inside of the metal mold was depressurized to a vacuum level, and compression molding was performed for 3 min so that a resin thickness was 300 μm to cure and seal. After curing and sealing, post cure was performed at 170° C. for 4 hours, thereby a sealed semiconductor devices mounting substrate (IV-c) was obtained.

Warp, appearances, an adhesion state of the resin and the substrate, whether each semiconductor device has been peeled away from the wafer or not were checked with respect to the semiconductor devices forming substrates (I-c) and (III-c), sealed in Example 1 and Comparative Example 1, and the semiconductor devices mounting substrates (II-c) and (IV-c), sealed in Example 2 and Comparative Example 2. Table 1 shows results. Here, in regard to the appearance, existence of voids and an unfilled state was checked, and the appearance was determined to be excellent when the existence was not found. Moreover, as to the adhesion state, the adhesion state was determined to be excellent when the resin did not peel away from the substrate at the time of molding.

TABLE 1

| | Example 1 | Example 2 | Comparative Example 1 | Comparative Example 2 |
| --- | --- | --- | --- | --- |
| Appearance | Excellent | Excellent | Excellent | Excellent |
| Warp of wafer (mm) | <0.1 | <0.1 | 12 | 10 |
| Adhesion state | Excellent | Excellent | Excellent | Excellent |
| Appearance (void) | None | None | None | Small void |
| Appearance (unfilled state) | None | None | None | None |
| Peel of semiconductor devices | — | None | — | Yes |

Based on the above results, as shown by Comparative Examples 1 and 2 using no support wafer according to the invention, it was found out that, when the semiconductor devices forming surface of the wafer on which semiconductor devices are formed or the semiconductor devices mounting surface of the substrate on which semiconductor devices were mounted were collectively sealed in these comparative examples, the sealed semiconductor devices forming wafer (III-c) and the sealed semiconductor devices mounting substrate (IV-c) fabricated greatly warped and the semiconductor devices peeled away from the substrate were found (Table 1). On the other hand, as shown by the examples, in the sealed semiconductor devices forming wafer (I-c) and the sealed semiconductor devices mounting substrate (II-c), sealed with the sealant laminated composite according to the invention, it was found out that the warp of the substrate was greatly suppressed, the appearance and the adhesion state were excellent, and voids or unfilled states were not produced either. Thus, the sealant laminated composite according to the invention can suppress the contraction stress when curing the uncured resin layer, whereby the warp of the substrate or the wafer and the peeling of the semiconductor devices from the substrate can be suppressed.

Example 3

[Fabrication of Resin-Impregnated Fiber Base Material (Support Wafer)]

To obtain a base composition, 189 g of the organosilicon compound having a non-conjugated double bond (A1) obtained in Synthesis Example 1, 189 g of the organohydrogenpolysiloxane (B1) obtained in Synthesis Example 2, 0.2 g of acetylene alcohol-based ethynylcyclohexanol as a reaction inhibitor, 0.1 g of an octyl alcohol solution of 1% by mass of chloroplatinic acid were added and the mixture was thoroughly stirred with a planetary mixer heated at 60° C. To the base composition, added were 400 g of toluene as a solvent, 378 g of silica (trade name: ADMAFINE E5/24C, average particle size: about 3 μm, manufactured by Admatechs Co., Ltd.) as an inorganic filler, 12 g of a hydrotalcites compound (trade name: DHT-4A-2, $Mg_{4.5}Al_2(OH)_{13}CO_3.3.5H_2O$, manufactured by Kyowa Kasei Co., Ltd.), 40 g of zinc molybdate (trade name: 911B, manufactured by Sherwin-Williams Japan Co., Ltd.) and 2 g of lanthanum oxide (manufactured by Shin-Etsu Chemical Co., Ltd.), thereby a toluene dispersion of a silicone resin composition was fabricated.

By dipping E glass cloth (manufactured by Nitto Boseki Co., Ltd., thickness: 50 μm) as a fiber base material in the toluene dispersion of the silicone resin composition, the glass cloth was impregnated with the toluene dispersion. The glass cloth was left to stand for 2 hours at 60° C. to volatilize toluene. On both sides of the E glass cloth from which toluene was volatilized, a film that is solid at room temperature (25° C.) was formed. The glass cloth was compression molded at 150° C. for 10 min with a hot press machine to obtain a molded article, further, the molded article was subjected to second curing at 150° C. for 1 hour to cure an impregnated thermosetting resin composition, thereby a silicone resin-impregnated fiber base material (V-a) was obtained.

Further, by dipping E glass cloth (manufactured by Nitto Boseki Co., Ltd., thickness: 50 μm) as a fiber base material in the toluene dispersion of the silicone resin composition, the glass cloth was impregnated with the toluene dispersion, the glass cloth was left to stand for 2 hours at 60° C. to volatilize toluene, and, a silicone resin-impregnated fiber base material (VI-a) where the impregnated thermosetting resin composition was semi-cured was obtained. On both sides of the E glass cloth from which toluene was volatilized, a film that is solid at room temperature (25° C.) was formed.

[Fabrication of Composition for Forming Uncured Resin Layer Constituted of Uncured Thermosetting Resin]

With respect to a composition where 50 parts by mass of the organosilicon compound having a non-conjugated double bond (A1), 50 parts by mass of organohydrogenpolysiloxane (B1), 0.2 parts by mass of acetylene alcohol-based ethynyl-cyclohexanol as a reaction inhibitor, and 0.1 parts by mass of an octyl alcohol-modified solution of chloroplatinic acid were added, further, 350 parts by mass of spherical silica having an average particle size of 5 μm, 3 parts by mass of a hydrotalcites compound (trade name: DHT-4A-2, $Mg_{4.5}Al_2(OH)_{13}CO_3.3.5H_2O$, manufactured by Kyowa Kasei Co., Ltd.), 10 parts by mass of zinc molybdate (trade name: 911B, manufactured by Sherwin-Williams Japan Co., Ltd.) and 0.5 parts by mass of lanthanum oxide (manufactured by Shin-Etsu Chemical Co., Ltd.) were added and the mixture was thoroughly stirred with a planetary mixer heated at 60° C., thereby a silicone resin composition (V-b) was fabricated. The composition was solid at room temperature (25° C.).

[Fabrication of Sealant Laminated Composite]

The silicone resin composition (V-b) was sandwiched between the silicone resin-impregnated fiber base material (V-a) (expansion coefficient: x-y direction 20 ppm) and a fluororesin-coated PET film (release film) and compression molded at 80° C. under pressure of 5 ton for 5 min with a hot-press machine, thereby a sealant laminated composite (V-c) where an uncured resin layer constituted of an uncured thermosetting resin composition having a thickness of 250 μm was formed on one side a silicone resin-impregnated fiber base material was fabricated. After that, the sealant-laminated composite (V-c) was cut into a rectangle of 60×220 mm.

[Covering and Sealing of Substrate on which Semiconductor Devices are Mounted]

Next, a vacuum lamination apparatus (manufactured by Nichigo-Morton Co., Ltd.) of which plate temperature was set to 130° C. was used to perform covering and sealing. First, an organic substrate made of a BT (bismaleimidotriazine) resin on which 14×14 mm Si chips (semiconductor device, thickness: 150 μm) having a thickness of 125 μm were mounted was set on a lower plate, and covered with the silicone resin composition (V-b) surface that was the uncured resin layer of the sealant laminated composite (V-c) from which a release film was removed such that the composition surface fitted to the semiconductor device mounting surface. Thereafter, the plate was closed and vacuum compression molding was performed for 5 min to cure and seal. After curing and sealing, a substrate that was sealed with the sealant laminated composite (V-c) was further subjected to post cure at 150° C. for 2 hours, thereby a sealed semiconductor devices mounting substrate (V-d) was obtained.

Example 4

[Fabrication of Composition for Forming Uncured Resin Layer Constituted of Uncured Thermosetting Resin]

With respect to a composition where 50 parts by mass of the organosilicon compound having a non-conjugated double bond (A1), 50 parts by mass of organohydrogenpolysiloxane (B1), 0.2 parts by mass of acetylene alcohol-based ethynyl-cyclohexanol as a reaction inhibitor, and 0.1 parts by mass of an octyl alcohol-modified solution of chloroplatinic acid were added, further, 350 parts by mass of spherical silica having an average particle size of 5 μm, 3 parts by mass of a hydrotalcites compound (trade name: DHT-4A-2, $Mg_{4.5}Al_2(OH)_{13}CO_3.3.5H_2O$, manufactured by Kyowa Kasei Co., Ltd.), 10 parts by mass of zinc molybdate (trade name: 911B, manufactured by Sherwin-Williams Japan Co., Ltd.) and 0.5 parts by mass of lanthanum oxide (manufactured by Shin-Etsu Chemical Co., Ltd.) were added and the mixture was thoroughly stirred with a planetary mixer heated at 60° C., thereby a silicone resin composition (VI-b) was fabricated. The composition was solid at room temperature (25° C.).

[Fabrication of Sealant Laminated Composite]

The silicone resin composition (VI-b) was sandwiched between the silicone resin-impregnated fiber base material (VI-a) (expansion coefficient: x-y direction 20 ppm) and a fluororesin-coated PET film (release film) and compression molded at 80° C. under pressure of 5 ton for 5 min with a hot-press machine, thereby a sealant laminated composite (VI-c) where an uncured resin layer constituted of an uncured thermosetting resin composition having a thickness of 250 μm was formed on one side of a silicone resin-impregnated fiber base material (VI-a) was fabricated. After molding, the sealant laminated composite (VI-c) was cut into a rectangle of 60×220 mm.

[Covering and Sealing of Substrate on which Semiconductor Devices are Mounted]

Next, a vacuum lamination apparatus (manufactured by Nichigo-Morton Co., Ltd.) of which plate temperature was set to 130° C. was used to perform covering and sealing. First, a 14×14 mm square Si chip (semiconductor device, thickness: 150 μm) was mounted on a lower plate, a BT substrate having a thickness of 125 μm was set, and covered with the silicone resin composition (VI-b) surface that was the uncured resin layer of the sealant laminated composite (VI-c) from which the release film was removed such that the composition surface fitted to the semiconductor devices mounting surface. The plate was then closed and vacuum compression molding was performed for 5 min to cure and seal. After curing and sealing, the substrate that was sealed with the sealant laminated composite (VI-c) was further subjected to post cure at 150° C. for 2 hours, thereby a sealed semiconductor devices mounting substrate (VI-d) was obtained.

Example 5

[Fabrication of Resin-Impregnated Fiber Base Material]

A 70 μm-thick epoxy resin substrate in which E glass cloth was contained as a fiber base material and expansion coefficient (x, y axis) thereof was controlled to 15 ppm by adding spherical silica having a particle size of 0.3 μm was fabricated as a resin-impregnated fiber base material (VII-a).

[Fabrication of Composition for Forming Uncured Resin Layer Constituted of Uncured Thermosetting Resin]

After 60 parts by mass of cresol novolak type epoxy resin (trade name: EOCN 1020, manufactured by Nippon Kayaku Co., Ltd.), 30 parts by mass of phenol novolak resin (trade name: H-4, manufactured by Gun Ei Chemical Industry Co., Ltd.), 400 parts by mass of spherical silica (manufactured by Tatumori Ltd., average particle size: 7 μm), 3 parts by mass of a hydrotalcites compound (trade name: DHT-4A-2, $Mg_{4.5}Al_2(OH)_{13}CO_3.3.5H_2O$, manufactured by Kyowa Kasei Co., Ltd.), 10 parts by mass of zinc molybdate (trade name: 911B, manufactured by Sherwin-Williams Japan Co., Ltd.), 0.5 parts by mass of lanthanum oxide (manufactured by Shin-Etsu Chemical Co., Ltd.), 0.2 parts by mass of catalyst TPP (triphenyl phosphine, manufactured by Hokko Chemical Industry Co., Ltd.) and 0.5 parts by mass of a silane coupling agent (trade name: KBM403, manufactured by Shin-Etsu Chemical Co., Ltd.) were thoroughly mixed with a high-speed mixer, the mixture was heated and kneaded with a continuous kneader to form it into a sheet and then cooled. The sheet was pulverized, thereby an epoxy resin composition (VI-b) was obtained as a granular powder.

[Fabrication of Sealant Laminated Composite]

A resin-impregnated fiber base material (VIII-a) was set on a lower metal mold of a compression molding machine capable of heating and pressurizing under reduced pressure, and a granular powder of the epoxy resin composition (VII-b) was uniformly dispersed on the material. The temperature of upper and lower metal molds was set to 80° C., a fluororesin-coated PET film (release film) was set on the upper metal mold and the inside of the metal mold was depressurized to a vacuum level, and compression molding was performed for 3 minutes so that the thickness of the uncured resin layer may be 250 μm, thereby a sealant laminated composite (VII-c) was fabricated. After molding, the sealant-laminated composite was cut into a rectangle of 60×220 mm.

[Covering and Sealing of Substrate on which Semiconductor Devices are Mounted]

Next, a vacuum lamination apparatus (manufactured by Nichigo-Morton Co., Ltd.) of which a plate temperature was set to 170° C. was used to perform covering and sealing. First, an epoxy resin substrate with a 14×14 mm square Si chip (semiconductor device, thickness: 150 μm) mounted thereon and having a thickness of 125 μm was set on a lower plate, and covered with the epoxy resin composition (VII-b) surface that was the uncured resin layer of the sealant laminated composite (VII-c) from which the release film was removed such that the composition surface fitted to the semiconductor devices mounting surface of the epoxy resin substrate. The plate was then closed and vacuum compression molding was performed for 5 min to cure and seal. After curing and sealing, post cure was performed at 170° C. for 4 hours, thereby a sealed semiconductor devices mounting substrate (VII-d) was obtained.

Example 6

[Substrate on which Semiconductor Devices are Mounted]

On a 60×220 mm rectangular epoxy resin substrate, through an adhesive of which adhesion force deteriorated at a high temperature, 20 pieces of silicon chips (shape: 14 mm×14 mm, thickness: 150 μm) were arranged and mounted.

[Covering and Sealing of Substrate on which Semiconductor Devices are Mounted]

A vacuum lamination apparatus (manufactured by Nichigo-Morton Co., Ltd.) of which a plate temperature was set to 170° C. was used to cover and seal the substrate. First, the epoxy resin substrate on which semiconductor devices were mounted was set on a lower plate, a sealant laminated composite (VIII-c) fabricated similarly to Example 3 except that the thickness of the uncured resin layer was 210 μm was cut into a 60×220 mm rectangle, and the resultant composite was set on the substrate. A peel film was removed, and an epoxy resin composition (VIII-b) surface that was a uncured resin layer of the sealant laminated composite (VIII-c) was covered such that the composition surface fitted to the semiconductor devices mounting surface on the epoxy resin substrate. By closing a plate and by performing vacuum compression molding for 5 min, a resin on the silicon chip was then cured and sealed so that the thickness of the resin on the silicon chip was 60 μm (the thickness of a sealing resin layer is 210 μm). After curing and sealing, post cure was performed at 170° C. for 4 hours and a sealed semiconductor devices mounting substrate (VIII-d) was obtained.

Example 7

With respect to a composition where 50 parts by mass of the organosilicon compound having a non-conjugated double bond (A1), 50 parts by mass of organohydrogenpolysiloxane (B1), 0.2 parts by mass of acetylene alcohol-based ethynyl-cyclohexanol as a reaction inhibitor, and 0.1 parts by mass of an octyl alcohol-modified solution of chloroplatinic acid, 350 parts by mass of spherical silica having an average particle size of 5 μm were added and the mixture was thoroughly stirred with a planetary mixer heated at 60° C., thereby a silicone resin composition (IX-b) was fabricated. The composition was solid at 25° C.

[Fabrication of Sealant Laminated Composite]

The silicone resin composition (IX-b) was sandwiched between the silicone resin-impregnated fiber base material (V-a) (expansion coefficient: x-y direction 20 ppm) and a fluororesin-coated PET film (release film) and compression molded at 80° C. under pressure of 5 ton for 5 min with a hot-press machine, thereby a sealant laminated composite (IX-c) where an uncured resin layer constituted of a 2000 μm-thick uncured thermosetting resin was formed on one side of the silicone resin-impregnated fiber base material (V-a) was fabricated. After molding, the sealant laminated composite (IX-c) was cut into a rectangle of 60×220 mm.

[Covering and Sealing of Substrate on which Semiconductor Devices are Mounted]

Next, a vacuum lamination apparatus (manufactured by Nichigo-Morton Co., Ltd.) of which a plate temperature was set to 130° C. was used to perform covering and sealing. First, a 14×14 mm square Si chip (semiconductor device, thickness: 725 μm) was mounted on a lower plate, a BT substrate having a thickness of 125 μm was set, and covered with the silicone resin composition (IX-b) surface that was the uncured resin layer of the sealant laminated composite (IX-c) from which the release film was removed such that the composition surface fitted to the semiconductor device mounting surface on the BT substrate. The plate was then closed and vacuum compression molding was performed for 5 min to cure and seal. After curing and sealing, the substrate that was sealed with the sealant laminated composite (IX-c) was further subjected to post cure at 150° C. for 2 hours, thereby a sealed semiconductor devices mounting substrate (IX-d) was obtained.

Comparative Example 3

With respect to a composition where 50 parts by mass of the organosilicon compound having a non-conjugated double bond (A1), 50 parts by mass of organohydrogenpolysiloxane (B1), 0.2 parts by mass of acetylene alcohol-based ethynylcyclohexanol as a reaction inhibitor, and 0.1 parts by mass of an octyl alcohol-modified solution of chloroplatinic acid, 350 parts by mass of spherical silica having an average particle size of 5 μm were added and the mixture was thoroughly stirred with a planetary mixer heated at 60° C., thereby a silicone resin composition (X-b) was fabricated. The composition was solid at 25° C.

[Fabrication of Sealing Sheet]

The silicone resin composition (X-b) was sandwiched between a PET film (base film for pressurizing) and a fluororesin-coated PET film (release film), compression molded for 5 min under pressure of 5 ton at 80° C. using a hot press machine to mold into a film having a thickness of 250 μm, thereby a sealing sheet (X-c) constituted of only a silicone resin composition (X-b) was fabricated. After molding, the sheet was cut into a 60×220 mm rectangle.

[Covering and Sealing of Substrate on which Semiconductor Devices are Mounted]

Next, a vacuum lamination apparatus (manufactured by Nichigo-Morton Co., Ltd.) of which a plate temperature was set to 130° C. was used to perform covering and sealing. First, to a lower plate, a 60×220 mm BT substrate having a thickness of 125 μm and 14×14 mm square Si chips (semiconductor device, thickness: 150 μm) mounted thereon was set, and stacked with the sealing sheet (X-c) constituted of only a silicone resin composition (X-b) from which the release film was removed. After peeling also a PET film (base film for pressurizing), the plate was closed and vacuum compression molding was performed for 5 min to cure and seal. After curing and sealing, post cure was performed at 150° C. for 2 hours, thereby a sealed semiconductor devices mounting substrate (X-d) was obtained.

Comparative Example 4

[Substrate on which Semiconductor Devices are Mounted]

On a 60×220 mm BT resin substrate having a thickness of 300 μm, through an adhesive of which adhesion force deteriorates at a high temperature, 20 pieces of silicon chips (shape: 14 mm×14 mm, thickness: 150 μm) were arranged and mounted.

[Covering and Sealing of Substrate on which Semiconductor Devices are Mounted]

The substrate on which semiconductor devices were mounted was set on a lower metal mold of a compression molding machine capable compression molding under reduced pressure, and a granular powder of the epoxy resin composition (XI-b) fabricated in the same manner as that of Example 3 was uniformly dispersed oh the substrate. The temperature of upper and lower metal molds was set to 170° C., a fluororesin-coated PET film (release film) was set on the upper metal mold and the inside of the metal mold was depressurized to a vacuum level, and curing and sealing were performed by compression molding for 3 min so that the thickness of the uncured resin layer was 250 μm. After curing and sealing, post cure was performed at 170° C. for 4 hours, thereby a sealed semiconductor devices mounting substrate (XI-d) was obtained.

Warp, appearances, an adhesion state between the resin and the substrate, and whether each semiconductor device has been peeled away from the metal substrate or not were checked with respect to the sealed semiconductor devices mounting substrates that were sealed in Examples 3 to 7, and Comparative Examples 3 to 4. Table 2 shows results. Here, in regard to the appearance, existence of voids and an unfilled state were checked, and the appearance was determined to be excellent when the existence was not found. Moreover, as to the adhesion state, the adhesion state was determined to be excellent when the resin did not peel away from the substrate at the time of molding.

TABLE 2

|  | Example 3 | Example 4 | Example 5 | Example 6 | Example 7 | Comparative Example 3 | Comparative Example 4 |
|---|---|---|---|---|---|---|---|
| (1) | Added | Added | Not added | Not added | Added | — | — |
| (2) | Added | Added | Added | Added | Not added | Not added | Added |
| (3) | 250 | 250 | 250 | 210 | 2000 | 250 | 250 |
| (4) | Excellent | Excellent | Excellent | Excellent | Excellent | Excellent | Excellent |
| (5) | 0.2 | 0.3 | 0.1 | 0.3 | 0.3 | 12 | 9 |
| (6) | Excellent | Excellent | Excellent | Excellent | Excellent | Excellent | Excellent |
| (7) | Excellent | Excellent | Excellent | Excellent | Excellent | Excellent | Small void |
| (8) | Not found | Not found | Not found | Not found | Not found | Not found | Not found |
| (9) | E glass | E glass | E glass | E glass | E glass | — | — |
| (10) | BT substrate | BT substrate | Epoxy resin substrate | Epoxy resin substrate | BT substrate | BT substrate | BT substrate |
| (11) | None | None | None | None | None |  |  |

Note:
(1) An ion trapping agent in a thermosetting resin composition with which a fiber base material is impregnated.
(2) An ion trapping agent in a thermosetting resin composition that constitutes an uncured resin layer.
(3) The thickness of an uncured resin layer (μm)
(4) Appearance
(5) Warp of substrate (mm)
(6) Adhesion state
(7) Appearance (void)
(8) Appearance (unfilling)
(9) Glass fiber
(10) Substrate
(11) Peeling of semiconductor device from substrate Based on the above results, as shown by Comparative Examples 3 and 4 using no sealant-laminated composite according to the invention, it was found out that, when the semiconductor devices mounting surfaces were collectively sealed in these comparative examples, the sealed semiconductor devices mounting substrates to be fabricated greatly warped and the semiconductor devices peeled away from the substrate were found (Table 2). On the other hand, as shown by the examples, in the sealed semiconductor devices mounting substrates sealed with the sealant laminated composite of the invention, it was found out that the warp of the substrate was greatly suppressed, the appearance and the adhesion state were excellent, and voids or unfilled states were not produced either. Thus, it was demonstrated that the resin-impregnated fiber base material according to the invention can suppress the contraction stress when curing the uncured resin layer, whereby the warp of the substrate and the peeling of the semiconductor devices from the substrate can be suppressed.

Further, the sealed semiconductor devices mounting substrates according to Examples 3 to 7 were diced into each piece, and 10 samples of semiconductor apparatuses each having a solder ball attached thereto were prepared for each of tests. The following heat resistance test and humidity resistance test were performed on the semiconductor apparatuses. Since the sealed semiconductor devices mounting substrates formed according to Comparative Examples 3 and 4 was not able to be diced into each piece because they had large warp, the peeling of the semiconductor devices from the substrate of the diced semiconductor apparatuses was not able to be evaluated.

[Heat Resistance Test]

The heat cycle test (repeating 1000 times a cycle of 10-minute hold at −25° C. and 10-minute hold at 125° C.) was performed to evaluate whether the continuity is maintained after test or not.

[Humidity Resistance Test]

Under condition of a temperature of 85° C. and relative humidity of 85%, a direct current voltage of 10 V was applied to both electrodes of a circuit, and by using a migration tester (trade name: MIG-86, manufactured by IMV Corporation), the number of short-circuit defects after 250 hours was measured.

TABLE 3

|  | Example 3 | Example 4 | Example 5 | Example 6 | Example 7 |
| --- | --- | --- | --- | --- | --- |
| Heat resistance test (turning on electricity after 1000 cycles) | Excellent | Excellent | Excellent | Excellent | Excellent |
| Humidity resistance test (the number of defects after 250 hr) | 0/10 | 0/10 | 0/10 | 0/10 | 0/10 |

As shown in Table 3, in both of the heat resistance test and the humidity resistance test, defects such as disconnection and crack were not found in Examples 3 to 7. Based on this, it was demonstrated that reliability of the semiconductor apparatus that was sealed with the sealant laminated composite of the invention is high.

The invention is not limited to the above-described embodiments. The embodiments are only illustrations, and all that has substantially the same configuration and the same effect with that of technical concepts described in claims of the invention is contained in the technical range of the invention.

What is claimed is:

1. A sealant laminated composite for collectively sealing a semiconductor devices mounting surface of a substrate on which semiconductor devices are mounted or a semiconductor devices forming surface of a wafer on which semiconductor devices are formed, comprising:
   a support wafer; and
   an uncured resin layer constituted of an uncured thermosetting resin formed on one side of the support wafer,
   wherein the support wafer is a resin-impregnated fiber base material constituted of a fiber base material impregnated with a thermosetting resin composition that is semi-cured or cured, the uncured resin layer is constituted of an uncured thermosetting resin composition formed on one side of the resin-impregnated fiber base material with a thickness more than 200 μm and 2000 μm or less, and at least one of the thermosetting resin composition that is impregnated in the fiber base material and the thermosetting resin composition that constitutes the uncured resin layer contains an ion trapping agent.

2. The sealant laminated composite according to claim 1, wherein the uncured resin layer contains any one of an epoxy resin, a silicone resin, and an epoxy/silicone mixed resin that solidify at less than 50° C. and melt at 50° C. or more and 150° C. or less.

3. The sealant laminated composite according to claim 1, wherein both the thermosetting resin composition that is impregnated in the fiber base material and the thermosetting resin composition that constitutes the uncured resin layer contain the ion trapping agent.

4. A sealed semiconductor devices mounting substrate, wherein a semiconductor devices mounting surface of a substrate on which semiconductor devices are mounted is covered with the uncured resin layer of the sealant laminated composite according to claim 1, and the uncured resin layer is heated and cured to collectively seal the semiconductor devices mounting surface with the sealant laminated composite.

5. A sealed semiconductor devices forming wafer, wherein a semiconductor devices forming surface of a wafer on which semiconductor devices are formed is covered with the uncured resin layer of the sealant laminated composite according to claim 1, and the uncured resin layer is heated and cured to collectively seal the semiconductor devices forming surface with the sealant laminated composite.

6. A method for manufacturing a semiconductor apparatus, comprising the steps of:
   covering a semiconductor devices mounting surface of a substrate on which semiconductor devices are mounted, or a semiconductor devices forming surface of a wafer on which semiconductor devices are formed with the uncured resin layer of the sealant laminated composite according to claim 1;
   collectively sealing the semiconductor devices mounting surface or the semiconductor devices forming surface by heating and curing the uncured resin layer to form a sealed semiconductor devices mounting substrate or a sealed semiconductor devices forming wafer; and
   dicing the sealed semiconductor devices mounting substrate or the sealed semiconductor devices forming wafer into each piece to manufacture the semiconductor apparatus.

7. The sealant laminated composite according to claim 2, wherein both the thermosetting resin composition that is impregnated in the fiber base material and the thermosetting resin composition that constitutes the uncured resin layer contain the ion trapping agent.

8. A semiconductor apparatus obtained by dicing the sealed semiconductor devices mounting substrate according to claim 4 or the sealed semiconductor devices forming wafer according to claim 5 into each piece.

9. A sealed semiconductor devices mounting substrate, wherein a semiconductor devices mounting surface of a substrate on which semiconductor devices are mounted is covered with the uncured resin layer of the sealant laminated composite according to claim 7, and the uncured resin layer is heated and cured to collectively seal the semiconductor devices mounting surface with the sealant laminated composite.

10. A sealed semiconductor devices forming wafer, wherein a semiconductor devices forming surface of a wafer on which semiconductor devices are formed is covered with the uncured resin layer of the sealant laminated composite according to claim 7, and the uncured resin layer is heated and cured to collectively seal the semiconductor devices forming surface with the sealant laminated composite.

11. A method for manufacturing a semiconductor apparatus, comprising the steps of:

covering a semiconductor devices mounting surface of a substrate on which semiconductor devices are mounted, or a semiconductor devices forming surface of a wafer on which semiconductor devices are formed with the uncured resin layer of the sealant laminated composite according to claim 7;

collectively sealing the semiconductor devices mounting surface or the semiconductor devices forming surface by heating and curing the uncured resin layer to form a sealed semiconductor devices mounting substrate or a sealed semiconductor devices forming wafer; and dicing the sealed semiconductor devices mounting substrate or the sealed semiconductor devices forming wafer into each piece to manufacture the semiconductor apparatus.

12. A semiconductor apparatus obtained by dicing the sealed semiconductor devices mounting substrate according to claim 9 or the sealed semiconductor devices forming wafer according to claim 10 into each piece.

\* \* \* \* \*